United States Patent
Yoo et al.

(10) Patent No.: US 12,262,570 B2
(45) Date of Patent: Mar. 25, 2025

(54) ORGANIC ELECTRIC ELEMENT, DISPLAY PANEL COMPRISING THE SAME AND DISPLAY DEVICE COMPRISING THE SAME

(71) Applicants: LG DISPLAY CO., LTD., Seoul (KR); SOLUS ADVANCED MATERIALS CO., LTD., Iksan-si (KR)

(72) Inventors: Seonkeun Yoo, Paju-si (KR); Heejun Park, Paju-si (KR); Soyoung Jang, Paju-si (KR); Jiho Baek, Paju-si (KR); Jeongdae Seo, Paju-si (KR); Sunkap Kwon, Paju-si (KR); Minchul Jun, Paju-si (KR); Hyunchul Choi, Paju-si (KR); Young Mo Kim, Paju-si (KR); Jae Yi Sim, Paju-si (KR)

(73) Assignees: LG DISPLAY CO., LTD., Seoul (KR); SOLUS ADVANCED MATERIALS CO., LTD., Iksan-si (KR)

( * ) Notice: Subject to any disclaimer, the term of this patent is extended or adjusted under 35 U.S.C. 154(b) by 996 days.

(21) Appl. No.: 17/136,653

(22) Filed: Dec. 29, 2020

(65) Prior Publication Data

US 2021/0202846 A1 Jul. 1, 2021

(51) Int. Cl.
| | |
|---|---|
| *C09K 11/06* | (2006.01) |
| *H10K 85/60* | (2023.01) |
| *H10K 50/15* | (2023.01) |
| *H10K 50/16* | (2023.01) |

(52) U.S. Cl.
CPC ....... *H10K 85/633* (2023.02); *H10K 85/6572* (2023.02); *H10K 85/6574* (2023.02); *H10K 85/6576* (2023.02); *H10K 50/15* (2023.02); *H10K 50/16* (2023.02)

(58) Field of Classification Search
CPC ............ H10K 85/633; H10K 85/6572; H10K 85/6574; H10K 85/6576
See application file for complete search history.

(56) References Cited

U.S. PATENT DOCUMENTS

| | | | |
|---|---|---|---|
| 2015/0333277 A1* | 11/2015 | Kim | C07D 335/04 546/14 |
| 2016/0141514 A1* | 5/2016 | Lee | C07D 251/24 544/333 |
| 2016/0322583 A1* | 11/2016 | Kim | C09K 11/025 |
| 2016/0372524 A1 | 12/2016 | Yun et al. | |
| 2019/0214571 A1 | 7/2019 | Huh et al. | |
| 2020/0194706 A1* | 6/2020 | Han | H10K 85/6576 |
| 2022/0115596 A1* | 4/2022 | Sim | C07D 335/04 |

FOREIGN PATENT DOCUMENTS

| | | | |
|---|---|---|---|
| CN | 105655496 A | 6/2016 | |
| CN | 108257704 A | 12/2016 | |
| CN | 109584982 A | 4/2019 | |
| CN | 105732588 B * | 10/2020 | ........... C07D 401/14 |

(Continued)

OTHER PUBLICATIONS

Machien translation of KR 2017-076436 (no date).*

*Primary Examiner* — Amanda C. Walke
(74) *Attorney, Agent, or Firm* — Birch, Stewart, Kolasch & Birch, LLP

(57) ABSTRACT

Provided are an organic electric element, a display panel and a display device having high efficiency or long life by including layers having excellent hole transport ability and carrier resistance.

10 Claims, 6 Drawing Sheets

(56) References Cited

FOREIGN PATENT DOCUMENTS

| KR | 2014135117 A | * | 11/2014 | ........... C07D 221/20 |
|---|---|---|---|---|
| KR | 2015063917 A | * | 6/2015 | ............... B01D 8/00 |
| KR | 10-2016-0150184 A | | 12/2016 | |
| KR | 2017076436 A | * | 7/2017 | ........... C07D 209/82 |
| KR | 10-2018-0046150 A | | 5/2018 | |
| WO | WO-2014072017 A1 | * | 5/2014 | ........... C07D 311/90 |
| WO | WO-2018012718 A1 | * | 1/2018 | ........... C07D 251/24 |
| WO | WO 2018/038401 A1 | | 3/2018 | |
| WO | WO 2018/080066 A1 | | 5/2018 | |

* cited by examiner

ORGANIC ELECTRIC ELEMENT, DISPLAY PANEL COMPRISING THE SAME AND DISPLAY DEVICE COMPRISING THE SAME

CROSS REFERENCE TO RELATED APPLICATION

This application claims priority to the Korean Patent Application No. 10-2019-0180027, filed on Dec. 31, 2019 in the Republic of Korea, which is hereby incorporated by reference for all purposes as if fully set forth herein.

BACKGROUND

Field of the Invention

Embodiments relate to an organic electric element, a display panel and a display device including the organic electric element.

Discussion of the Related Art

In general, an organic light emitting phenomenon refers to the phenomenon of converting electrical energy into light energy by means of an organic material. An organic electric element refers to an electric element using the organic light emitting phenomenon.

An organic electric element using the organic light emitting phenomenon can be applied to a display device. Since the portable display device is driven by a battery, which is a limited power source, an organic electric element used in the portable display device requires excellent light emission efficiency. In addition, since the image should be displayed normally during use of the electronic device, a long life of the organic electric element can be also required.

In order to improve efficiency, lifespan and driving voltage in the organic electric element, research has been conducted on the organic material included in the organic electric element.

SUMMARY OF THE INVENTION

Embodiments of the present invention can provide an organic electric element having high efficiency or long life by including layers having excellent hole transport ability and carrier resistance.

Embodiments of the present invention can provide a display panel having high efficiency or long life by including the above-described organic electric element.

Further, embodiments of the present invention can provide a display device having high efficiency or long life by including the above-described display panel.

According to an aspect, embodiments of the present invention can provide an organic electric element comprising a first electrode, a second electrode and an organic layer.

The organic layer is positioned between the first electrode and the second electrode.

The organic layer comprises an emitting layer, a first layer and a second layer.

The first layer comprises a compound represented by the following chemical formula 1.

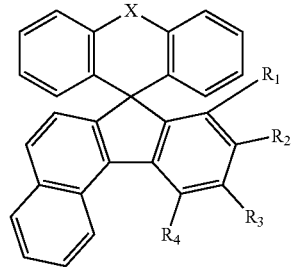

[chemical formula 1]

The second layer comprises a compound represented by the following chemical formula 2.

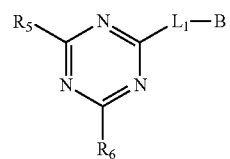

[chemical formula 2]

According to other aspects, embodiments of the present invention can provide a display panel comprising a subpixel comprising the organic electric element.

According to another aspect, embodiments of the present invention can provide a display device comprising the display panel and a driving circuit for driving the display panel.

According to embodiments of the present invention, it is possible to provide the organic electric device having high luminous efficiency and long life by including layers having excellent hole transport ability and carrier resistance.

According to embodiments of the present invention, it is possible to provide a display panel including the organic electric device having a high luminous efficiency and long life and a display device comprising the same.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION OF THE EMBODIMENTS

Figure 1:
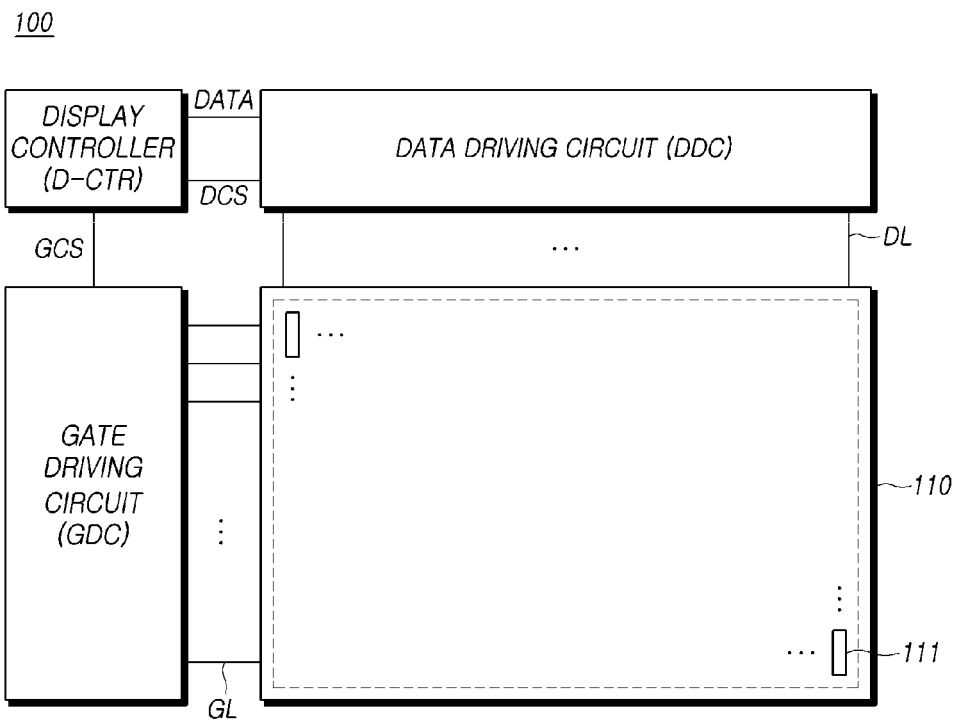
FIG. 1 is a system configuration diagram of a display device according to embodiments of the present invention.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description can make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

The term "halo" or "halogen" as used herein refers to fluorine (F), bromine (Br), chlorine (Cl), or iodine (I) unless otherwise indicated.

As used herein, the term "alkyl" or "alkyl group" refers to a saturated aliphatic functional radical of 1 to 60 carbon atoms with a single bond therein, including a straight chain alkyl group, a branched chain alkyl group, a cycloalkyl (alicyclic) group, an alkyl-substituted cycloalkyl group, and a cycloalkyl-substituted alkyl group, unless otherwise indicated.

The term "haloalkyl group" or "halogenalkyl group", as used herein, means a halogen-substituted alkyl group unless otherwise specified.

The term "heteroalkyl group", as used herein, means that at least one of the carbon atoms constituting the alkyl group has been replaced with a heteroatom.

As used herein, the terms "alkenyl group" and "alkynyl group", refer to a straight or branched chain of 2 to 60 carbon atoms with a double and a triple bond therein, respectively, unless stated otherwise, but are not limited thereto.

Unless otherwise stated, the term "cycloalkyl" as used herein refers to an alkyl forming a ring having 3 to 60 carbon atoms, without being limited thereto.

Unless otherwise stated, the term "alkoxyl group", "alkoxy group", or "alkyloxy group" as used herein means an alkyl group of 1 to 60 carbon atoms having an oxygen radical attached thereto, but is not limited thereto.

As used herein, the term "alkenoxyl group", "alkenoxy group", "alkenyloxyl group", or "alkenyloxy group" means an alkenyl group of 2 to 60 carbon atoms having an oxygen radical attached thereto, unless otherwise stated, but is not limited thereto.

As used herein, the term "aryloxyl group" or "aryloxy group" means an aryl group of 6 to 60 carbon atoms having an oxygen radical attached thereto unless otherwise specified, but is not limited thereto.

As used herein, the terms "aryl group" and "arylene group" each refer to having 6 to 60 carbon atoms unless otherwise stated, but are not limited thereto. In the present disclosure, an aryl group or an arylene group means a single or multiple aromatic ring, including an aromatic ring which is formed as neighboring substituents participate in a bond or a reaction. For example, the aryl group can be a phenyl group, a biphenyl group, a terphenyl group, a naphthyl group, an anthracenyl group, a fluorene group, a spirofluorene group, or a spirobifluorene group.

The prefix "aryl" or "ar" means a radical substituted with an aryl group. For example, an arylalkyl group is an alkyl group substituted with an aryl group and an arylalkenyl group is an alkenyl group substituted with an aryl group. In this regard, the radical substituted with an aryl group has the number of carbon atoms described herein.

Also, when prefixes are named consecutively, it means that the substituents are listed in the order described first. By way of example, an arylalkoxy group means an alkoxy group substituted with an aryl group, an alkoxylcarbonyl group means a carbonyl group substituted with an alkoxyl group, and an arylcarbonylalkenyl group means an alkenyl group substituted with an arylcarbonyl group wherein the arylcarbonyl group is a carbonyl group substituted with an aryl group.

As used herein, the term "heteroalkyl" means an alkyl bearing one or more heteroatoms unless otherwise indicated. As used herein, the terms "heteroaryl group" and "heteroarylene group" refer respectively to an aryl group and an arylene group of 2 to 60 carbon atoms bearing one or more heteroatoms therein, unless otherwise specified, without being limited thereto. It can include at least one of a single ring and multiple rings, and can be formed by combining adjacent functional groups.

Unless otherwise indicated, the term "heterocyclic group" as used herein, refers to at least one of heteroaliphatic rings and heteroaromatic rings of 2 to 60 carbon atoms bearing one or more heteroatoms as a ring member thereof, which can be mono- or multi-cyclic and can be formed as neighboring functional groups combine with each other.

The term "heteroatom" as used herein refers to N, O, S, P, or Si unless otherwise stated.

"Heterocyclic groups" can also include rings comprising $SO_2$, in place of carbon atoms, as a ring member. For example, a "heterocyclic group" includes the following compounds.

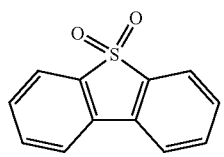

Unless otherwise stated, the term "aliphatic" as used herein means an aliphatic hydrocarbon of 1 to 60 carbon atoms, and the "aliphatic ring" means an aliphatic hydrocarbon ring of 3 to 60 carbon atoms.

Unless otherwise stated, the term "ring" as used herein refers to an aliphatic ring of 3 to 60 carbon atoms, an aromatic ring of 6 to 60 carbon atoms, a hetero ring of 2 to 60 carbon atoms, or a fused ring consisting of a combination thereof whether or not it is saturated or unsaturated.

Other hetero-compounds or hetero-radicals other than the aforementioned hetero-compounds include, but are not limited to, one or more heteroatoms.

Unless otherwise stated, the term "carbonyl" as used herein is represented by —COR', wherein R' is hydrogen, an alkyl group of 1 to 20 carbon atoms, an aryl group of 6 to 30 carbon atoms, a cycloalkyl group of 3 to 30 carbon atoms, an alkenyl group of 2 to 20 carbon atoms, an alkynyl group of 2 to 20 carbon atoms, or a combination thereof.

Unless otherwise specified, the term "ether" as used herein is represented by —R—O—R', wherein R and R' are each independently hydrogen, an alkyl group of 1 to 20 carbon atoms, an aryl group of 6 to 30 carbon atoms, a cycloalkyl group of 3 to 30 carbon atoms, an alkenyl group of 2 to 20 carbon atoms, an alkynyl group of 2 to 20 carbon atoms, or a combination thereof.

Also, unless explicitly stated otherwise, the term "substituted" in the expression "substituted or unsubstituted" means having at least one substituent selected from the group consisting of, but not limited to, deuterium, halogen, an amino group, a nitrile group, a nitro group, a C1-C20 alkyl group, a C1-C20 alkoxyl group, a C1-C20 alkylamine group, a C1-C20 alkylthiophene group, a C6-C20 arylthiophene group, a C2-C20 alkenyl group, a C2-C20 alkynyl, a C3-C20 cycloalkyl group, a C6-C20 aryl group, a deuterium-substituted C6-C20 aryl group, a C8-C20 aryl alkenyl group, a silane group, a boron group, a germanium group, and a C2-C20 hetero-ring.

Also, unless otherwise stated, the chemical formulas used in the present invention are as defined for the exponent parts of the substituent in the following chemical formula:

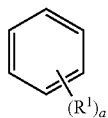

wherein,
when a is an integer of 0, the substituent R1 being null,
when a is an integer of 1, one substituent R1 is bonded to any one of the constituent carbon atoms of the benzene ring,
when a is an integer of 2 or 3, the substituents R1's, which can be the same or different, are each bonded as represented below, and
when a is an integer of 4 to 6, the substituents R1's are bonded to the constituents carbon atoms of the benzene ring in the same manner while the hydrogens bonded to the constituent carbon atoms of the benzene ring are not indicated:

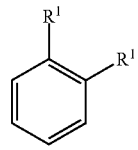

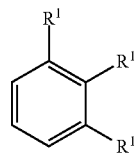

In the present specification, the formation of a ring by combining substituents with each other means that adjacent groups combine with each other to form a monocycle or single ring, a ring aggregated or a conjugated multi-cycle, and the monocycle, the ring aggregated and the formed conjugated multicycle can include the heterocycle including at least one heteroatom, and can include aromatic and non-aromatic rings.

In the present specification, the organic electric element can mean a component (s) between an anode and a cathode, or an organic light emitting diode including the anode, the cathode and the component(s) positioned therebetween.

In the present specification, the organic electric element can mean one of an organic electric device, the organic light emitting diode and the panel including the same, and an electronic device including the panel and a circuit. For example, the electronic device includes a display device, a lighting device, a solar cell, a portable or mobile terminal (e.g., a smart phone, a tablet, a PDA, an electronic dictionary, a PMP, etc.), a navigation terminal, a game machine, various TVs, and various computers monitor and the like, but is not limited thereto, and can be any type of device as long as the component(s) are included.

Hereinafter, exemplary embodiments of the present disclosure will be described in detail with reference to the accompanying drawings.

FIG. 1 is a system configuration diagram of a display device according to embodiments. All the components of the display device according to all embodiments of the present invention are operatively coupled and configured.

Referring to FIG. 1, a display device 100 in accordance with embodiments of the present disclosure includes a display panel 110 in which a plurality of data lines DL and a plurality of gate lines GL are arranged and a plurality of sub-pixels 111 defined by the plurality of data lines DL and the plurality of gate lines GL is arranged, a data driving circuit DDC (or a data driver) for driving the plurality of data lines DL, a gate driving circuit GDC (or a gate driver) for driving the plurality of gate lines GL, a controller D-CTR controlling the data driving circuit DDC and the gate driving circuit GDC, and the like.

The controller D-CTR controls operations of the data driving circuit DDC and the gate driving circuit GDC by supplying respective control signals (DCS, GCS) to the data driving circuit DDC and the gate driving circuit GDC.

The controller D-CTR starts the scan of pixels according to timings processed in each frame, converts image data inputted from other devices or other image providing sources to be adapted to a data signal form used in the data driving circuit DDC and then outputs image data DATA resulted from the converting, and causes the data to be loaded into the pixels at a pre-configured time according to the scan.

The controller D-CTR can be implemented as a separate component from the data driving circuit DDC or can be integrated with data driving circuit DDC so the controller D-CTR can be implemented as an integrated circuit.

The data driving circuit DDC drives the plurality of data lines DL by providing data voltages corresponding to image data DATA received from the controller D-CTR to the data lines DL. Here, the data driving circuit DDC is sometimes referred to as a source driving circuit or a source driver.

The data driving circuit DDC can include at least one source driver integrated circuit SDIC to be implemented.

Each source driver integrated circuit SDIC can include a shift register, a latch circuit, a digital to analog converter DAC, an output buffer, and/or the like.

In some instances, each source driver integrated circuit SDIC can further include one or more analog to digital converters ADC.

The gate driving circuit GDC sequentially drives a plurality of gate lines GL by sequentially providing scan signals to the plurality of gate lines GL. Here, the gate driving circuit GDC is sometimes referred to as a scan driving circuit or a scan driver.

The gate driving circuit GDC can include at least one gate driver integrated circuit GDIC to be implemented.

Each gate driver integrated circuit GDIC can include a shift register, a level shifter, and/or the like.

Each gate driver integrated circuit GDIC can be connected to a bonding pad of the display panel 110 in a tape automated bonding (TAB) type or a chip on glass (COG) type, or be directly disposed on the display panel 110 as being implemented in a gate in panel (GIP) type. In some instances, the gate driver integrated circuit GDIC can be disposed to be integrated with the display panel 110. Further, each gate driver integrated circuit GDIC can be implemented in a chip on film (COF) type in which the gate driver integrated circuit GDIC is mounted on a film connected with the display panel 110.

According to the controlling of the controller D-CTR, the gate driving circuit GDC sequentially provides scan signals of an on-voltage or an off-voltage to the plurality of gate lines GL.

When a specific gate line is asserted by a scan signal from the gate driving circuit GDC, the data driving circuit DDC converts image data DATA received from the controller D-CTR into analog data voltages and provides the obtained analog data voltages to the plurality of data lines DL.

The data driving circuit DDC can be located on, but not limited to, only one side (e.g., an upper side or a lower side) of the display panel 110, or in some instances, be located on, but not limited to, two sides (e.g., the upper side and the lower side) of the display panel 110 according to driving schemes, panel design schemes, or the like.

The gate driving circuit GDC can be located on, but not limited to, only one side (e.g., a left side or a right side) of the panel 110, or in some instances, be located on, but not limited to, two sides (e.g., the left side and the right side) of the display panel 110 according to driving schemes, panel design schemes, or the like.

The display device 100 according to embodiments of the present disclosure can be one of various types of display devices, such as, a liquid crystal display device, an organic light emitting display device, a plasma display device, or the like.

In case the display device 100 according to embodiments of the present disclosure is an organic light emitting display device, each sub-pixel 111 arranged in the display panel 110 can include circuit components, such as an organic light emitting diode (OLED), which is a self-emissive element, a driving transistor for driving the organic light emitting diode OLED, and the like.

Types of circuit elements and the number of the circuit elements included in each subpixel 111 can be different depending on types of the panel (e.g., an LCD panel, an OLED panel, etc.), provided functions, design schemes/features, or the like.

Figure 2:
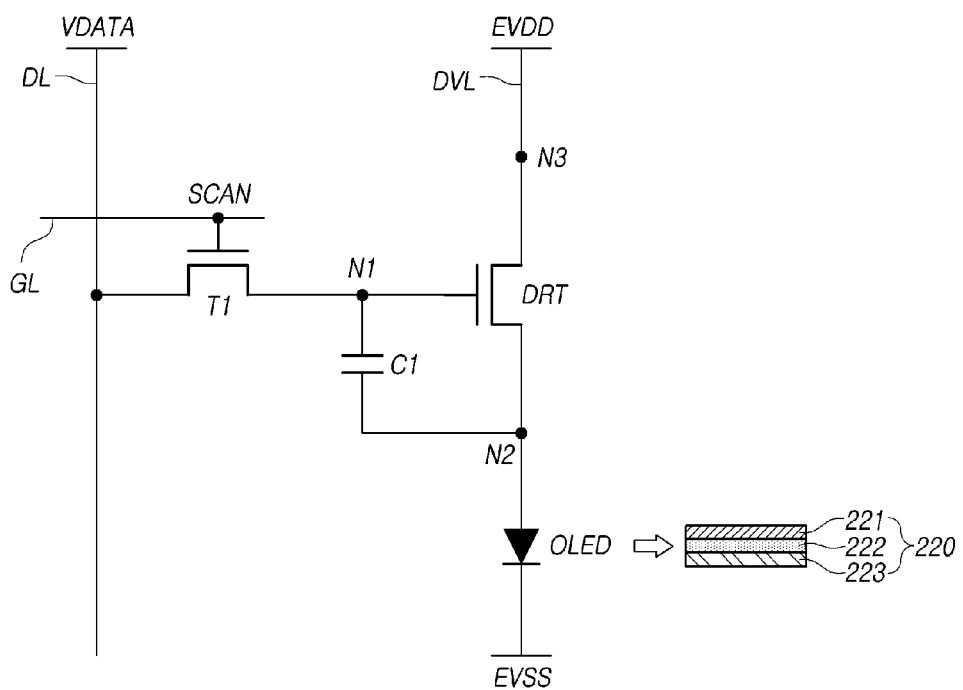
FIG. 2 and FIG. 3 are views illustrating examples of a subpixel circuit of a display panel according to embodiments of the present invention.
Figure 3:
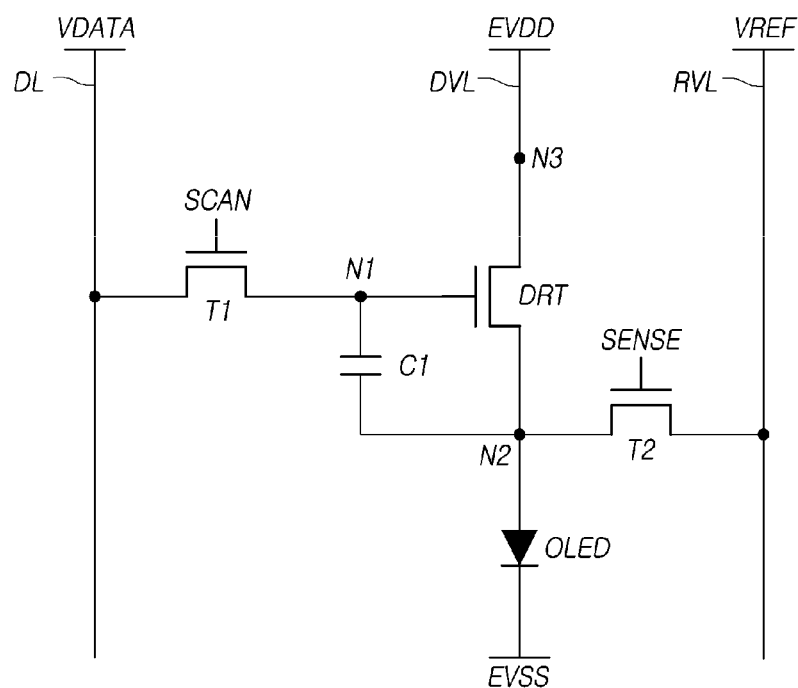

FIG. 2 and FIG. 3 are views illustrating examples of a subpixel circuit of a display panel according to embodiments. The subpixel circuits of FIGS. 2 and 3 can be used in the display panel of FIG. 1.

Referring to FIG. 2 and FIG. 3, each subpixel 111 can include an organic light emitting diode OLED and a driving transistor DRT for driving the organic light emitting diode OLED as basic circuit components.

Referring to FIG. 2, each sub-pixel 111 can further include a first transistor T1 allowing a data voltage VDATA to be applied to a first node N1 corresponding to a gate node of the driving transistor DRT, and a storage capacitor C1 for remaining a data voltage VDATA corresponding to an image signal voltage or a voltage corresponding to this during one frame time.

The organic light emitting diode OLED can include a first electrode 221 (an anode electrode or a cathode electrode), a light emitting layer 222, a second electrode 223 (the cathode electrode or the anode electrode), and the like.

In one embodiment, a low-level voltage EVSS can be applied to the second electrode 223 of the organic light emitting diode OLED.

The driving transistor DRT causes the organic light emitting diode OLED to be driven by providing a driving current to the organic light emitting diode OLED.

The driving transistor DRT includes a first node N1, a second node N2 and a third node N3.

The first node N1 of the driving transistor DRT can be a node corresponding to the gate node thereof, and can be electrically connected to a source node or a drain node of the first transistor T1.

The second node N2 of the driving transistor DRT can be electrically connected to the first electrode 221 of the organic light emitting diode OLED and can be a source node or a drain node.

The third node N3 of the driving transistor DRT can be the drain node or the source node as a node to which a driving voltage EVDD is applied, and can be electrically connected to a driving voltage line DVL used to supply a driving voltage EVDD.

The first transistor T1 can be electrically connected between a data line DL and the first node N1 of the driving transistor DRT and can be controlled by a scan signal SCAN that is provided through a gate line and applied to the gate node of the first transistor T1.

The storage capacitor C1 can be electrically connected between the first node N1 and the second node N2 of the driving transistor DRT.

The storage capacitor C1 is an external capacitor intentionally designed to be located outside of the driving transistor DRT, not an internal storage, such as a parasitic capacitor (e.g., a Cgs, a Cgd) that presents between the first node N1 and the second node N2 of the driving transistor DRT.

Referring to another example of FIG. 3, each sub-pixel 111 disposed on the display panel according to the present embodiments includes not only an organic light emitting device OLED, a driving transistor DRT, a first transistor T1, and a storage capacitor C1 but also the second transistor T2.

The second transistor T2 is electrically connected between a second node N2 of the driving transistor DRT and a reference voltage line RVL that supplies a reference voltage VREF, and can be controlled by receiving a sensing signal SENSE, which is a type of a scan signal to its gate node.

By further including the above-described second transistor T2, the voltage state of the second node N2 of the driving transistor DRT in the subpixel 111 can be effectively controlled.

The second transistor T2 is turned on by the sensing signal SENSE to apply the reference voltage VREF supplied through the reference voltage line RVL to the second node N2 of the driving transistor DRT.

Meanwhile, the scan signal SCAN and the sensing signal SENSE can be separate gate signals. In this case, the scan signal SCAN and the sensing signal SENSE can be applied to the gate node of the first transistor T1 and the gate node of the second transistor T2, respectively, through different gate lines.

In some cases, the scan signal SCAN and the sensing signal SENSE can be the same gate signal. In this case, the scan signal SCAN and the sensing signal SENSE can be commonly applied to the gate node of the first transistor T1 and the gate node of the second transistor T2 through the same gate line.

Figure 4:
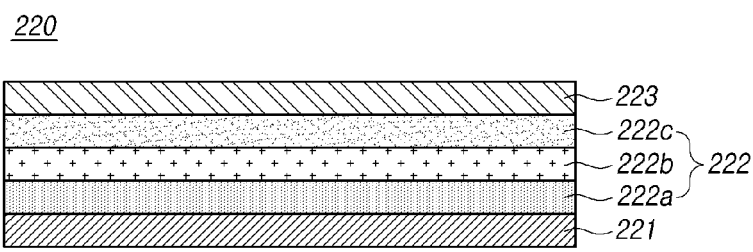
FIG. 4 to FIG. 6 are schematic cross-sectional views of the examples of an organic electric device according to embodiments of the present invention.

FIG. 4 is a cross-sectional view of an example of an organic electric device according to the embodiments. The organic electric devices of FIGS. 4-6 can be used in the display device according to one or more embodiments of the present disclosure.

Referring to FIG. 4, an organic electric element 220 according to the embodiments includes a first electrode 221 and a second electrode 223, an organic layer 222 positioned therebetween.

The first electrode 221 can be an anode and the second electrode 223 can be a cathode. In the case of an inverted type, the first electrode 221 can be a cathode and the second electrode 223 can be an anode.

For example, the first electrode 221 can be a transparent electrode, and the second electrode 223 can be a reflective electrode. In another example, the first electrode 221 can be a reflective electrode, and the second electrode 223 can be a transparent electrode.

The organic layer 222 can include a plurality of layers which is located between the first electrode 221 and the second electrode 223 and includes an organic material.

The organic layer includes a light emitting layer 222b, a first layer 222a and a second layer 222c.

The organic electric element 220 can be a tandem organic electric element including a plurality of stacks each including a light emitting layer. The plurality of light emitting layers can be made of the same material as each other, or can be made of different materials from each other.

The light emitting layer 222b is a layer in which energy generated by recombination of electrons and holes is emitted as light, and can include, for example, a host material and a dopant.

The first layer 222a can be positioned between the light emitting layer 222b and the first electrode 221. In this example, the first electrode 221 can be an anode electrode, and the first layer 222a can be a hole transport layer. When the first layer 222a is positioned between the light emitting layer 222b and the first electrode 221, the organic electric device can have high efficiency or long life.

The second layer 222c can be positioned between the light emitting layer 222b and the second electrode 223. In this example, the second electrode 223 is a cathode electrode, and the second layer 222c can be an electron transport layer. When the second layer 222c is positioned between the light emitting layer 222b and the second electrode 223, the organic electric device can have high efficiency or long life.

The first layer 222a can include a compound represented by the following chemical formula 1. Since the first layer 222a includes the compound represented by the chemical formula 1, the organic electric device can have high efficiency or long life. The compound represented by the chemical formula 1 will be described in detail later.

The second layer 222c can include a compound represented by the following chemical formula 2. Since the second layer 222c includes the compound represented by the chemical formula 2, the organic electric device can have high efficiency or long life. The compound represented by the following chemical formula 2 will be described in detail later.

The organic layer of the organic electric device according to embodiments of the present invention can include two or more light emitting layers.

Figure 5:
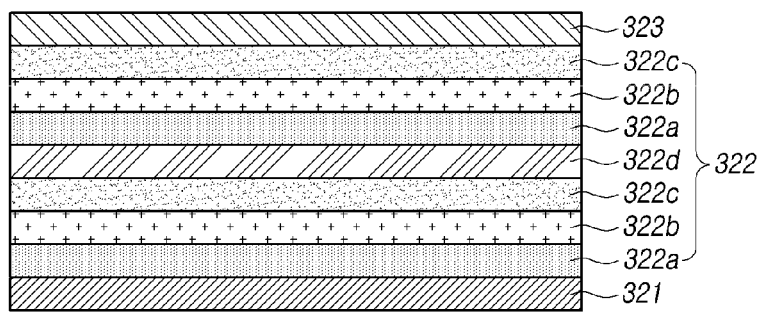

FIG. 5 is a cross-sectional view of another example of an organic electric device according to the embodiments.

Referring to FIG. 5, an organic electric element 320 according to the embodiments includes a first electrode 321 and a second electrode 323, an organic layer 322 positioned therebetween.

The organic layer 322 includes a light emitting layer 322b, a first layer 322a and a second layer 322c.

The organic electric element 320 can be a tandem organic electric element including two or more light emitting layers 322b. In FIG. 5, the organic layer 322 can include two light emitting layers 322d as one example. The light emitting layers can be made of the same material as each other, or can be made of different materials from each other.

The first layer 322a can be positioned between the first electrode 321 and the light emitting layer 322b adjacent to the first electrode 321. The light emitting layer 322b adjacent to the first electrode 321 means the light emitting layer 322b closest to the first electrode 321 among the plurality of light emitting layers 322b. In this example, the first electrode 321 can be an anode electrode, and the first layer 322a can be a hole transport layer. Since the first layer 322a is positioned as described above, the organic electric device 320 can have high efficiency or long life.

The second layer 322c can be positioned between the second electrode 323 and the light emitting layer 322b adjacent to the second electrode 323. The light emitting layer 322b adjacent to the second electrode 323 means the light emitting layer 322b closest to the second electrode 322 among the plurality of light emitting layers 322b. In this example, the second electrode 323 is a cathode electrode, and the second layer 322c can be an electron transport layer. Since the second layer 322c is positioned as described above, the organic electric device 320 can have high efficiency or long life.

The charge generating layer 322d is formed between the first layer 322a and the second layer 322c to smoothly distribute charges so that it can increase the current efficiency of the light emitting layer 322b. In FIG. 5, the charge generating layer 322d is illustrated as one layer, but the charge generating layer 322d includes a plurality of layers including a p-type charge generating layer (p-CGL) and an n-type charge generating layer (n-CGL).

The first layer 322a can be positioned between the plurality of the light emitting layers 322b. The second layer 322c can also be positioned between the plurality of the light emitting layers 322b.

Accordingly, the organic layer 222 of the organic electrical device 320 can include at least one first layer 322a and at least one second layer 322c. When there are multiple first layers 322a, each of the first layers 322a can be made of the same material, or can be made of different materials. When there are multiple second layers 322c, each second layer 322c can be made of the same material, or can be made of different materials.

In FIG. 5, the first layer 322a is positioned between the first electrode 321 and the light emitting layer 322b, and also between the light emitting layers 322b, but the embodiments are limited thereto. The embodiments of the present invention can include only one first layer 322a.

In FIG. 5, the second layer 322c is positioned between the second electrode 223 and the light emitting layer 322b, and also between the light emitting layers 322b, but the embodiments is not limited thereto. The embodiments can include only one second layer 322c.

Figure 6:
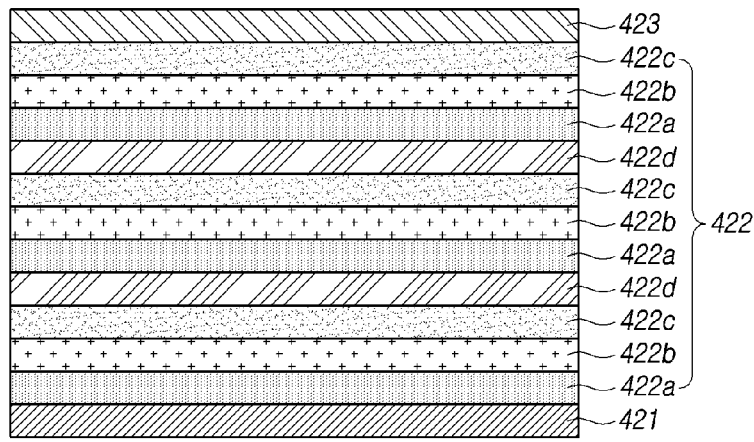

FIG. 6 is a cross-sectional view of another example of an organic electric device according to the embodiments.

Referring to FIG. 6, an organic electric element 420 according to the embodiments includes a first electrode 421 and a second electrode 423, an organic layer 422 positioned therebetween.

The organic layer 422 includes a light emitting layer 422b, a first layer 422a and a second layer 422c.

The organic electric element 420 can be a tandem organic electric element including two or more light emitting layers 422b. In FIG. 6, the organic layer 422 can include three light emitting layers 422d as one example. The light emitting layers 422d can be made of the same material as each other, or can be made of different materials from each other.

Even if the three light emitting layers 422b are included, the positions of the first layer 422a, the second layer 422c, and the charge generating layer 422c is similar to these of the first layer 322a, the second layer 322c, and the charge generating layer 322c with reference to FIG. 5.

In FIG. 6, the first layer 422a is positioned between the first electrode 421 and the light emitting layer 422b, and also between the light emitting layers 422b, but the embodiments are limited thereto. The embodiments of the present invention can include only one first layer 422a.

In FIG. 6, the second layer 422c is positioned between the second electrode 423 and the light emitting layer 422b, and also between the light emitting layers 422b, but the embodiments is not limited thereto. The embodiments can include only one second layer 422c.

In the embodiments of the present invention, an organic electric device including four or more light emitting layers is also included, and a person skilled in the art can understand the structure and the position of the first electrodes, the organic layer, and the second layer in this case with reference to the FIGS. 4 to 6.

The organic electric elements 220, 320 and 420 according to the embodiments can be a front emission type, a back emission type, or a double-sided emission type, depending on the material used.

Also, the organic layer 222, 322, 422 can include an additional layer in addition to the first layer, the light emitting layer, and the second layer.

The first layers 222a, 322a, and 422a include a compound represented by the following chemical formula 1.

[chemical formula 1]

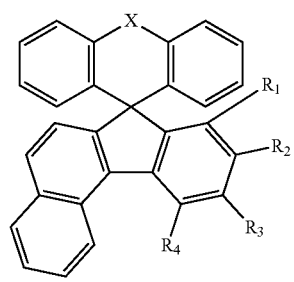

Hereinafter, the chemical formula 1 will be described.

X is O, S, CR' R" or $N_1$.

R' and R", which are same or different, are each independently one selected from the group consisting of a hydrogen; a deuterium; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring, R' and R" can be bonded to each other to form a ring.

In other examples, X can be O, S or N.

$R_1$ to $R_4$, which are same or different, are each independently one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; and -$L_3$-$N(Ar_2)(Ar_3)$.

In other examples, $R_1$ to $R_4$, which are same or different, are each independently one selected from the group consisting of a hydrogen; a deuterium; a tritium; and -$L_3$-$N(Ar_2)(Ar_3)$.

$R_1$ and $R_2$ can be bonded to each other to form a ring, $R_2$ and $R_3$ can be bonded to each other to form a ring, and $R_3$ and $R_4$ can be bonded to each other to form a ring. Among R1 to R3, those which are not bonded to each other to form a ring can be selected from the above mentioned group.

$L_2$ can be independently one selected from the group consisting of a single bond; a $C_6$-$C_{60}$ arylene group; a fluorenylene group; a $C_2$-$C_{60}$ hetero ring group containing at least one hetero atom from O, N, S, Si and P; and a fused ring group of a $C_3$-$C_{60}$ aliphatic ring and a $C_6$-$C_{60}$ aromatic ring.

In another example, $L_2$ can be the $C_6$-$C_{60}$ arylene group.

When $L_2$ is the arylene group, the arylene group can be a $C_6$ to $C_{60}$ arylene group, a $C_6$ to $C_{40}$ arylene group, or a $C_6$ to $C_{20}$ arylene group.

$Ar_1$ and $Ar_2$, which are same or different, are each independently one selected from the group consisting of a $C_6$-$C_{60}$ aryl group; a fluorenyl group; a $C_2$-$C_{60}$ hetero ring group containing at least one hetero atom from O, N, S, Si and P; and a fused ring group of a $C_3$-$C_{60}$ aliphatic ring and a $C_6$-$C_{60}$ aromatic ring.

When $Ar_1$ or $A_{r2}$ is the aryl group, the aryl group can be a $C_6$ to $C_{60}$ aryl group, a $C_6$ to $C_{40}$ aryl group, or a $C_6$ to $C_{20}$ aryl group.

When $Ar_1$ or $Ar_2$ is the hetero ring group, the hetero ring group can be a $C_2$ to $C_{60}$ hetero ring group, a $C_2$ to $C_{40}$ hetero ring group, or a $C_2$ to $C_{20}$ hetero ring group.

In the chemical formula 1, the aryl group, the fluorenyl group, the hetero ring group, the fused ring group, the alkyl group, the alkenyl group, the alkynyl group, the alkoxy group, the aryloxy group, the arylene group and the fluorenylene can each be further substituted with at least one substituent selected from the group consisting of a deuterium; a nitro group; a nitrile group; a cyano group; a halogen; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{20}$ cycloalkyl group; a $C_7$~$C_{20}$ arylalkyl group and a $C_8$~$C_{20}$ arylalkenyl group.

In addition, the additionally substituted substituents can be bond to each other to form a ring, and the additionally substituted substituents can each be further substituted with at least one substituent selected from the group consisting of a deuterium; a nitro group; a nitrile group; a cyano group; a halogen; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{20}$ cycloalkyl group; a $C_7$~$C_{20}$ arylalkyl group and a $C_8$~$C_{20}$ arylalkenyl group; and these substituents can be bonded to each other to form a ring.

The first layer 222a, 322a, and 422a can include one or more compounds among various types of compounds represented by the above mentioned chemical formula 1. Since the first layer 222a, 322a, and 422a includes the compound represented by the chemical formula 1, the organic electric device can have high efficiency or long life.

The compound represented by the chemical formula 1 can be a compound represented by any one of the following chemical formulas 1-1 to 1-4.

[chemical formula 1-1]

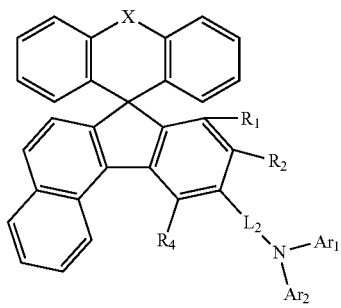

[chemical formula 1-2]

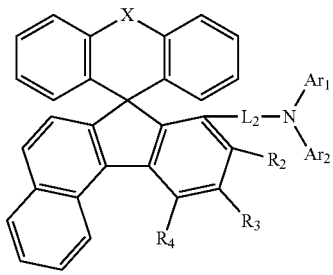

[chemical formula 1-3]

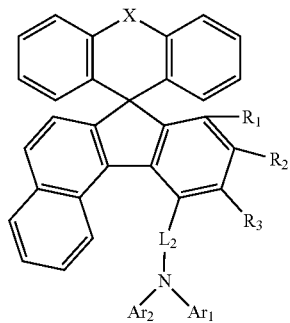

[chemical formula 1-4]

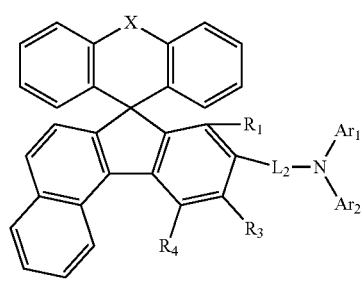

In the chemical formulas 1-1 to 1-4, X, $R_1$ to $R_4$, $L_2$, $Ar_1$ and $Ar_2$ are substantially the same as those described for the chemical formula 1.

When the first layer 222a, 322a, and 422a includes the compound represented by any one of the chemical formulas 1-1 to 1-4, the organic electric device can have high luminous efficiency or long life.

The compound represented by the chemical formula 1 can be one or more of the following compounds, but the compounds represented by the chemical formula 1 in the embodiments of the present invention are not limited to the following compounds.

SBX1

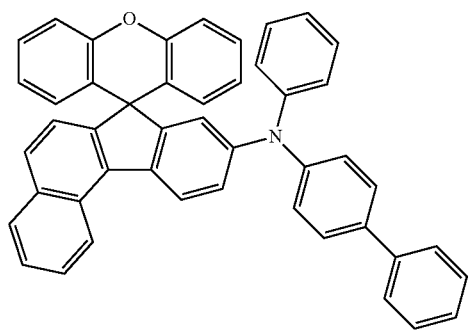

SBX2
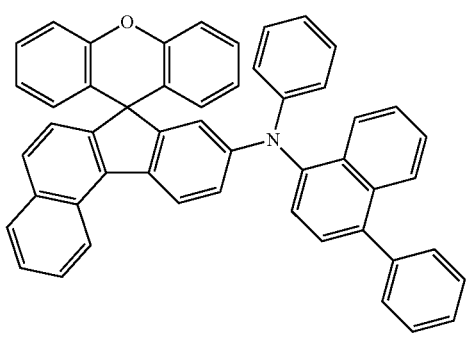
SBX3
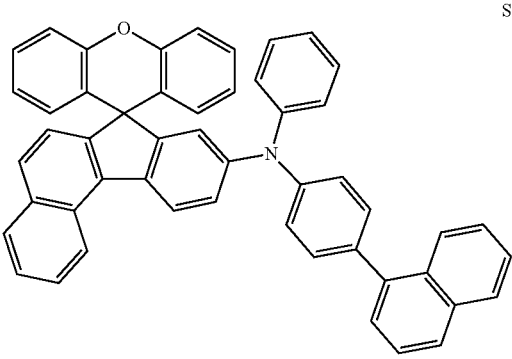
SBX4
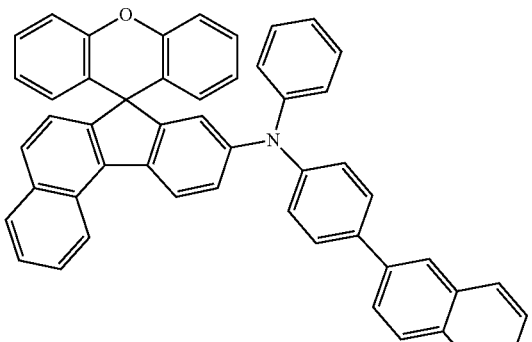
SBX5
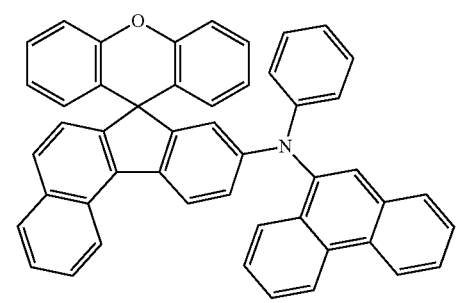
SBX6
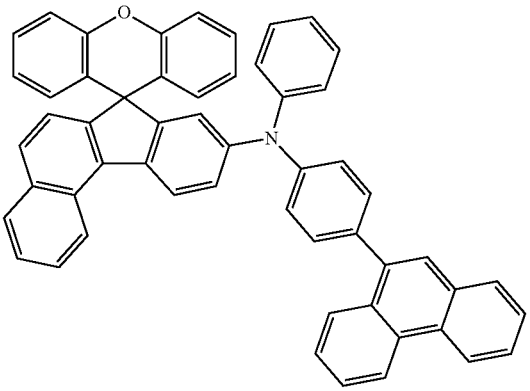
SBX7
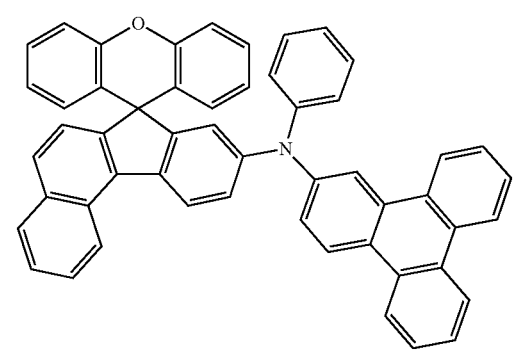
SBX8
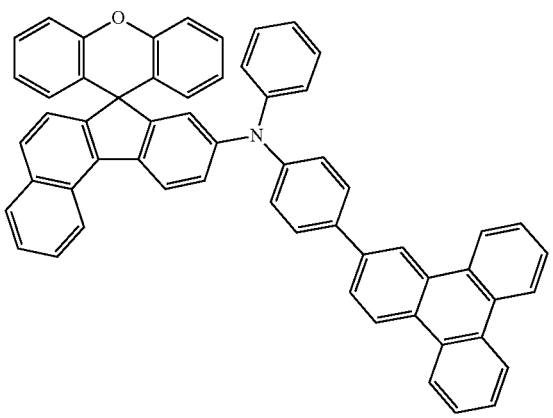
SBX9
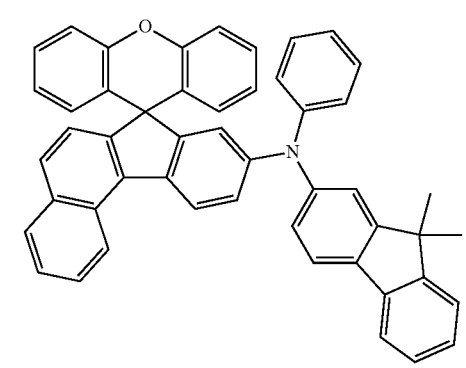

SBX10
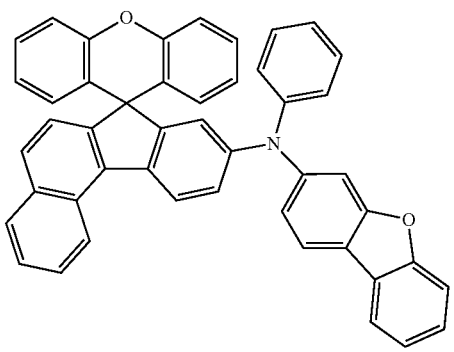
SBX11
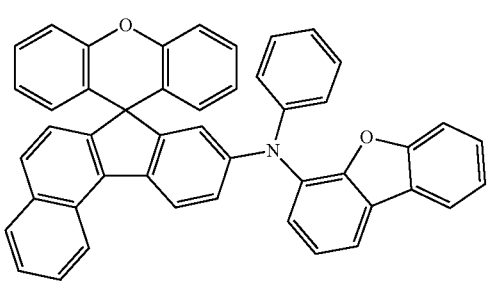
SBX12
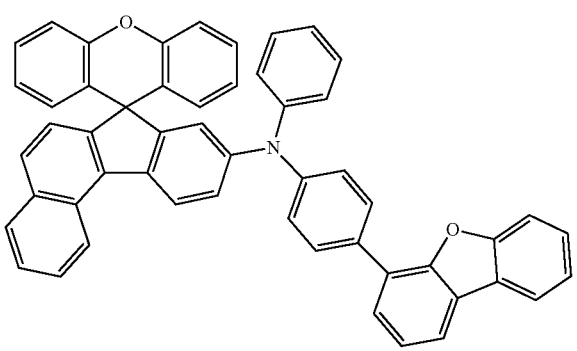
SBX13
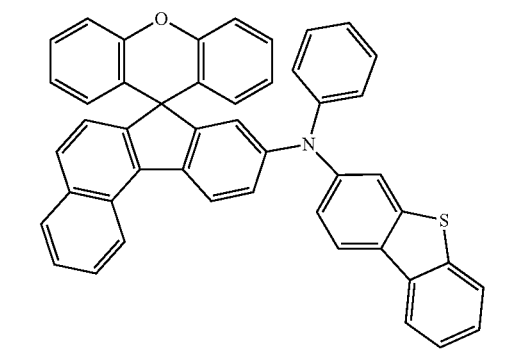
SBX14
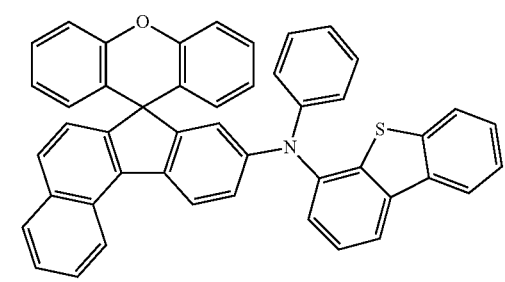
SBX15
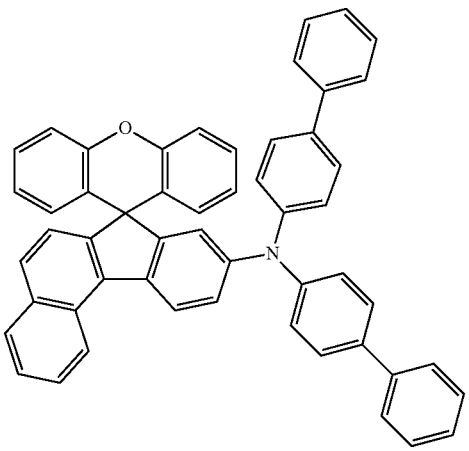
SBX16
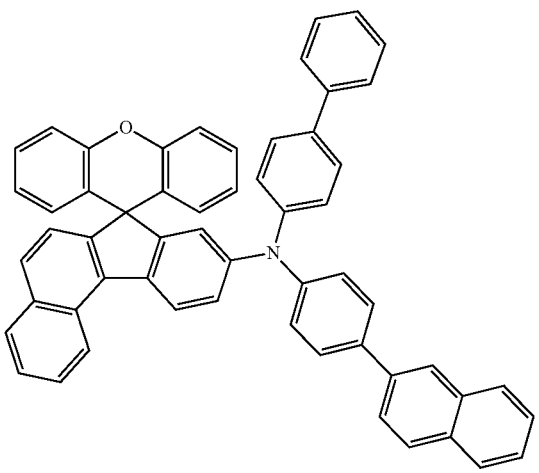
SBX17
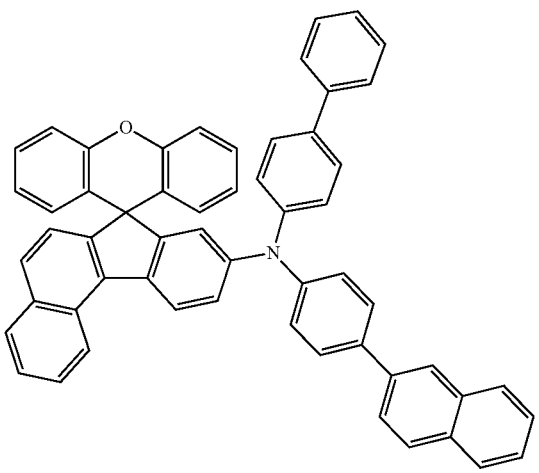

-continued
SBX18
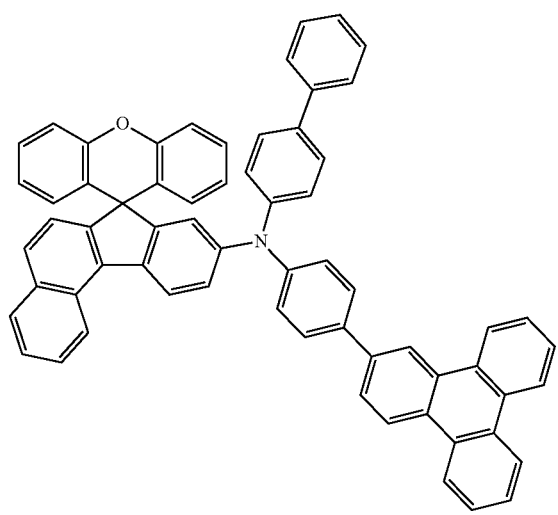
SBX19
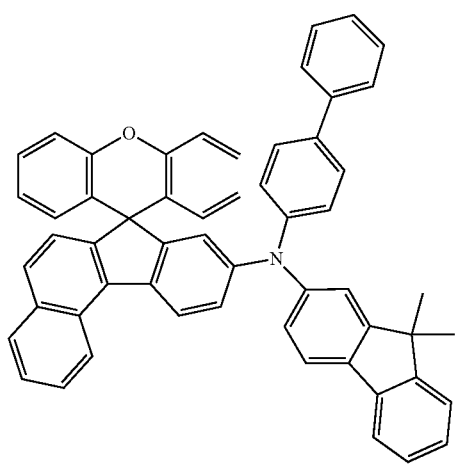
SBX20
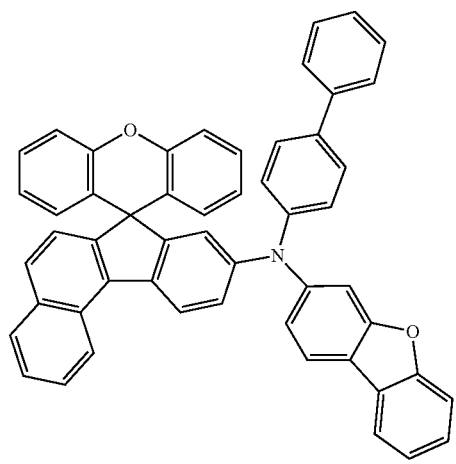
-continued
SBX21
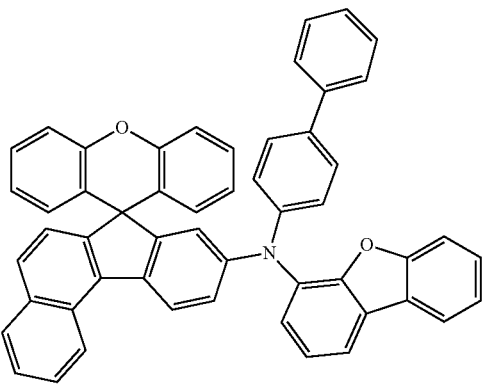
SBX22
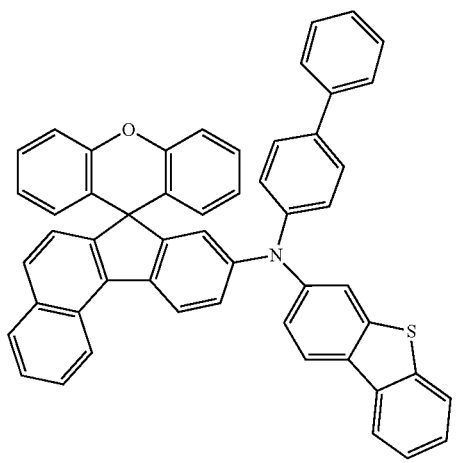
SBX23
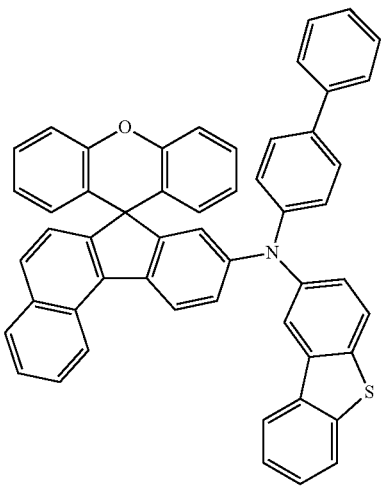

SBX24
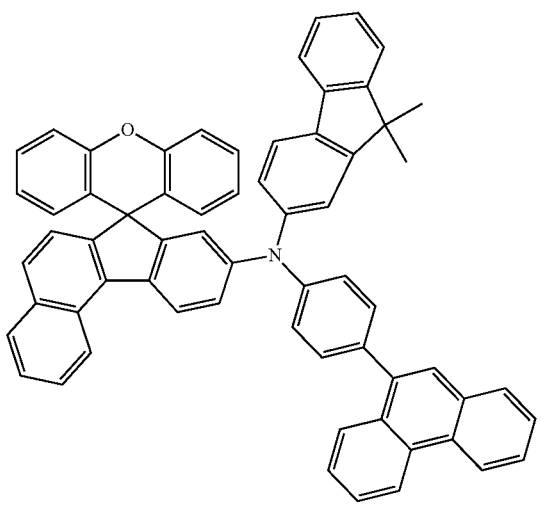
SBX27
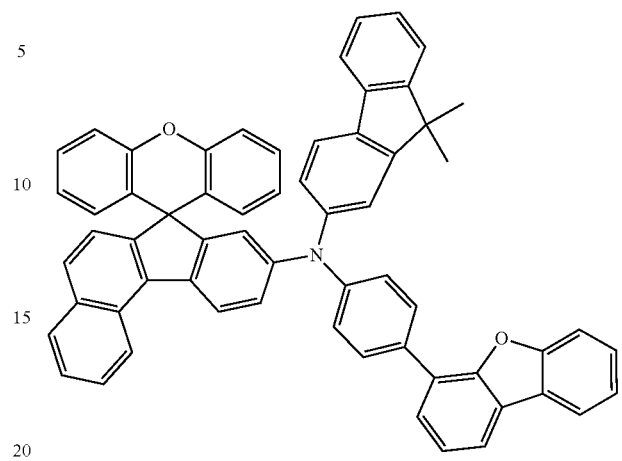
SBX25
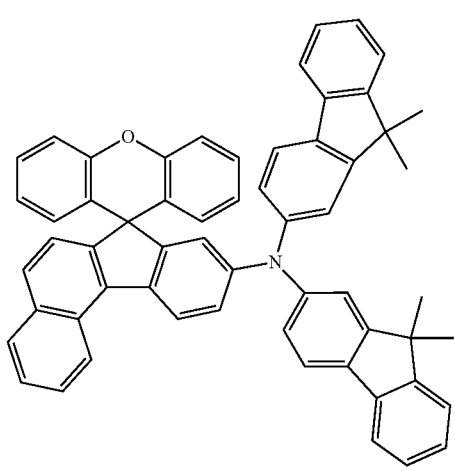
SBX28
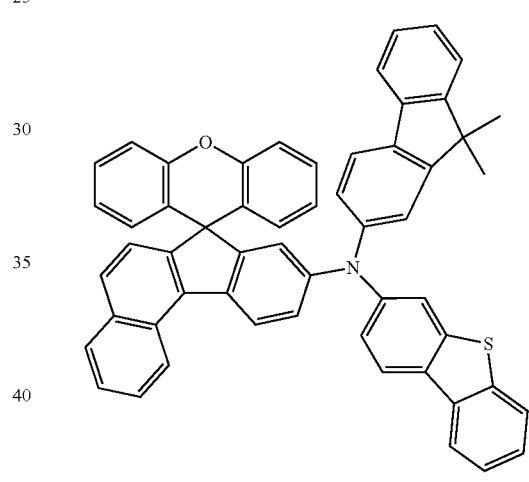
SBX26
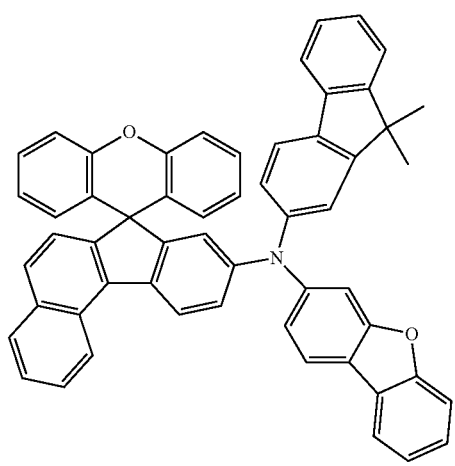
SBX29
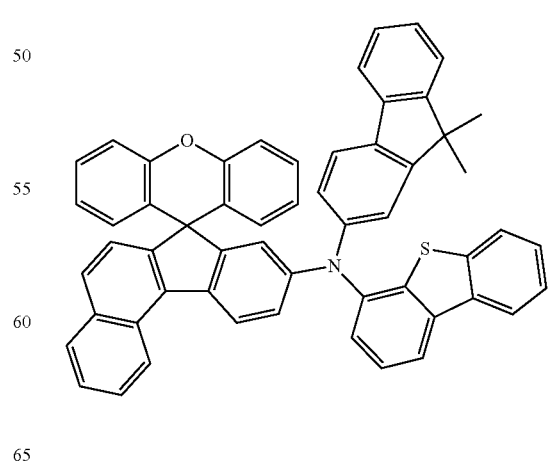

SBX30
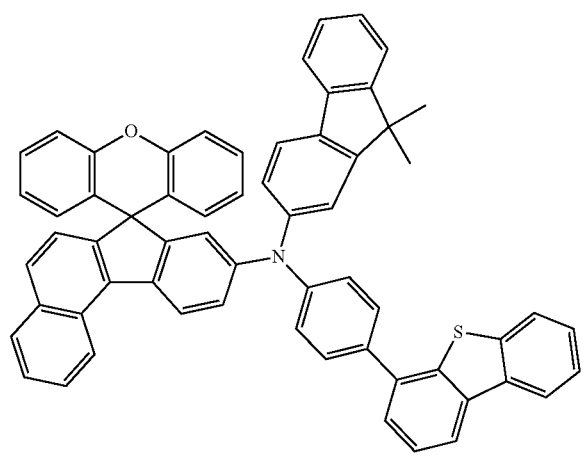
SBX31
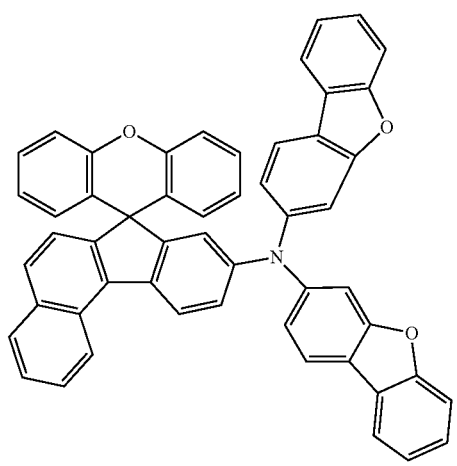
SBX32
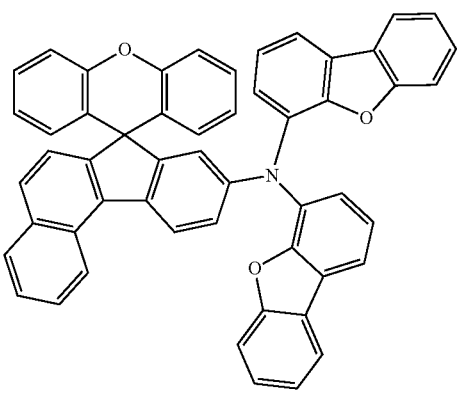
SBX33
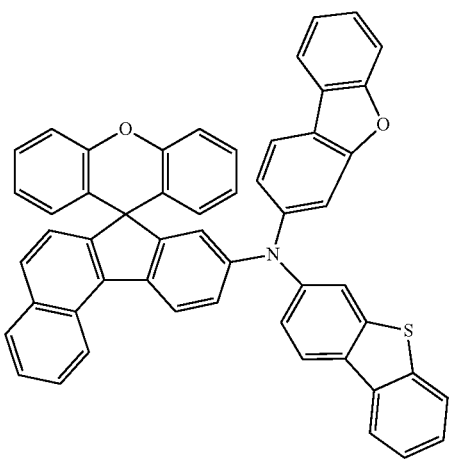
SBX34
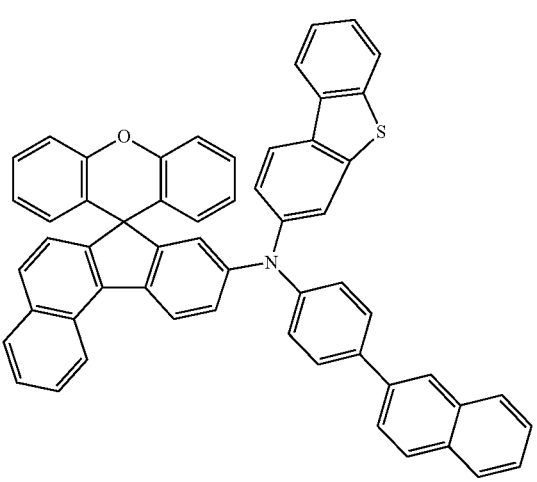
SBX35
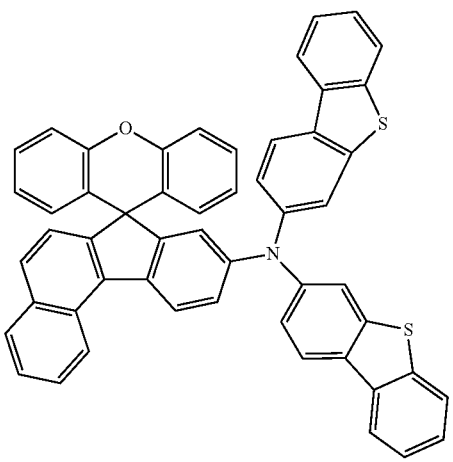

-continued
SBX36
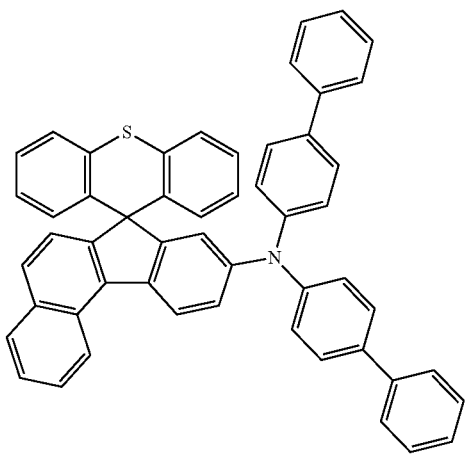
SBX37
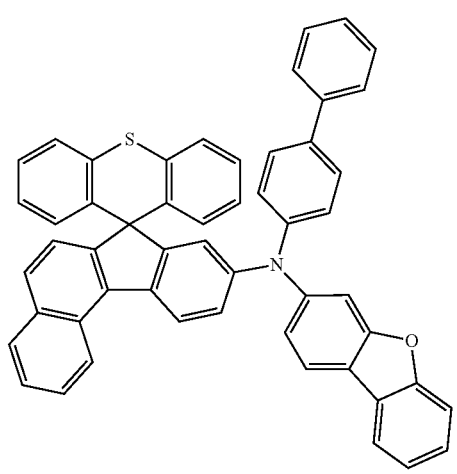
SBX38
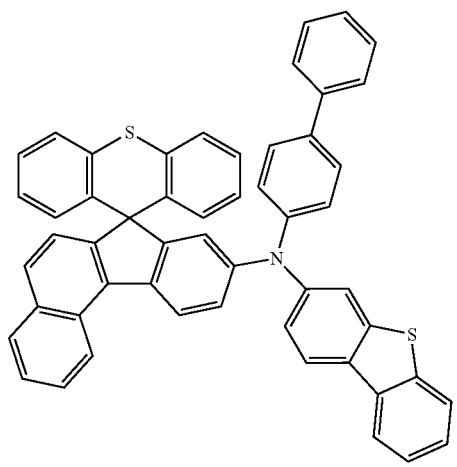
-continued
SBX39
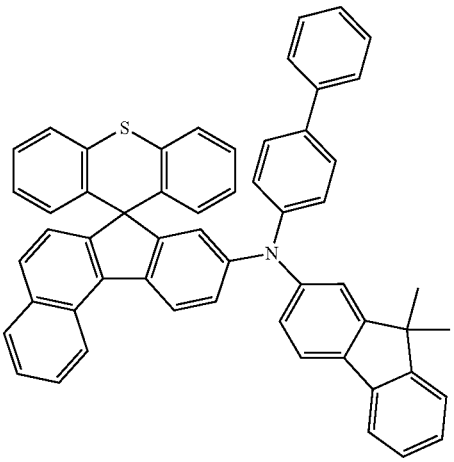
SBX40
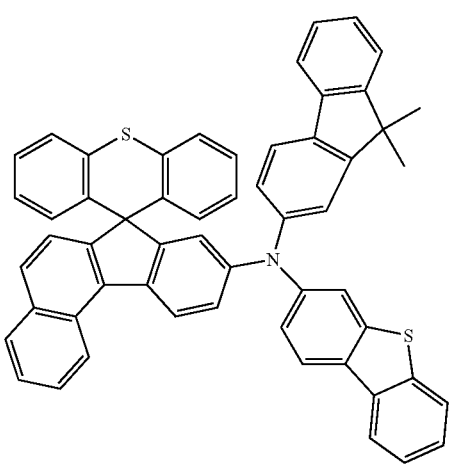
SBX41
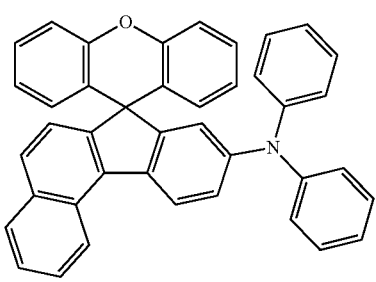
SBX42
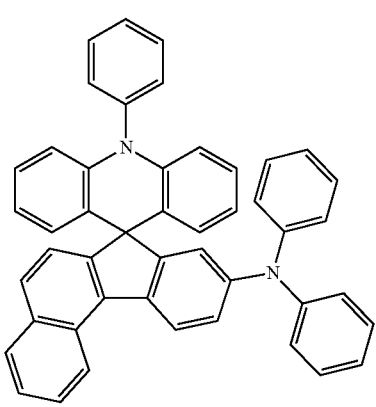

SBX43

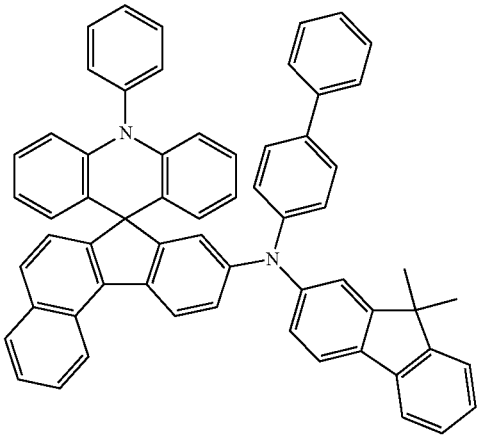

SBX44

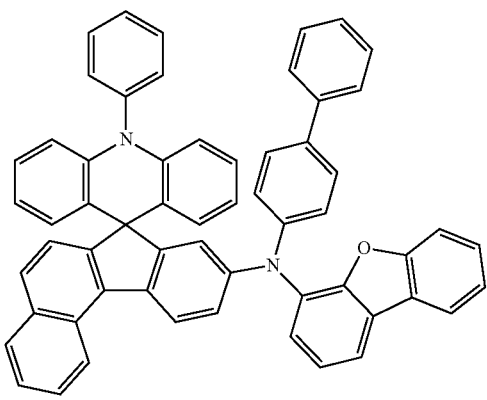

When the first layer 222a, 322a and 422a includes one or more of the above compounds, the organic electric device can have high luminous efficiency or long life.

The second layers 222c, 322c, and 422c include a compound represented by the following chemical formula 2.

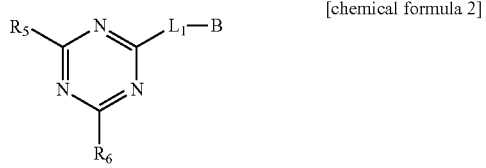

[chemical formula 2]

Hereinafter, the chemical formula 2 will be described.

$R_5$ and $R_6$, which are same or different, are each independently one selected from the group consisting of a hydrogen; a deuterium; a tritium; a halogen; a cyano group; a nitro group; a $C_6$~$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; and -$L_3$-N($Ar_2$)($Ar_3$).

In other examples, $R_5$ and $R_6$, which are same or different, are each independently the $C_6$~$C_{60}$ aryl group.

When $R_5$ and $R_6$ is the aryl group, the aryl group can be a $C_6$ to $C_{60}$ aryl group, a $C_6$ to $C_{40}$ aryl group, or a $C_6$ to $C_{20}$ aryl group.

$L_1$ and $L_3$, which are same or different, are each independently one selected from the group consisting of a single bond; a $C_6$~$C_{60}$ arylene group; a fluorenylene group; a $C_2$-$C_{60}$ hetero ring group containing at least one hetero atom from O, N, S, Si and P; and a fused ring group of a $C_3$-$C_{60}$ aliphatic ring and a $C_6$-$C_{60}$ aromatic ring.

In another example, $L_1$ and $L_3$ can be the $C_6$~$C_{60}$ arylene group.

When $L_1$ and $L_3$ is the arylene group, the arylene group can be a $C_6$ to $C_{60}$ arylene group, a $C_6$ to $C_{40}$ arylene group, or a $C_6$ to $C_{20}$ arylene group.

B is each independently one selected from the group consisting of a $C_6$-$C_{60}$ aryl group; a fluorenyl group; a $C_2$-$C_{60}$ hetero ring group containing at least one hetero atom from O, N, S, Si and P; and a fused ring group of a $C_3$-$C_{60}$ aliphatic ring and a $C_6$-$C_{60}$ aromatic ring.

When B is the aryl group, the aryl group can be a $C_6$ to $C_{60}$ aryl group, a $C_6$ to $C_{40}$ aryl group, or a $C_6$ to $C_{20}$ aryl group.

When B is the hetero ring group, the hetero ring group can be a $C_2$ to $C_{60}$ hetero ring group, a $C_2$ to $C_{40}$ hetero ring group, or a $C_2$ to $C_{20}$ hetero ring group.

$Ar_1$ and $Ar_2$ is the same as these in the chemical formula 1.

In the chemical formula 2, the aryl group, the fluorenyl group, the hetero ring group, the fused ring group, the alkyl group, the alkenyl group, the alkynyl group, the alkoxy group, the aryloxy group, the arylene group and the fluorenylene can each be further substituted with at least one substituent selected from the group consisting of a deuterium; a nitro group; a nitrile group; a cyano group; a halogen; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{20}$ cycloalkyl group; a $C_7$~$C_{20}$ arylalkyl group and a $C_8$~$C_{20}$ arylalkenyl group.

In addition, the additionally substituted substituents can be bond to each other to form a ring, and the additionally substituted substituents can each be further substituted with at least one substituent selected from the group consisting of a deuterium; a nitro group; a nitrile group; a cyano group; a halogen; an amino group; a $C_1$-$C_{20}$ alkylthio group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{20}$ cycloalkyl group; a $C_7$~$C_{20}$ arylalkyl group and a $C_8$~$C_{20}$ arylalkenyl group; and these substituents can be bonded to each other to form a ring.

The second layer 222c, 322c, 422c can include one or more compounds among various types of compounds represented by the above mentioned chemical formula 1. Since the first layer 222c, 322c, 422c includes the compound represented by the chemical formula 2, the organic electric device can have high efficiency or long life.

The B in the chemical formula 2 can be any one of the following chemical formulas.

B1
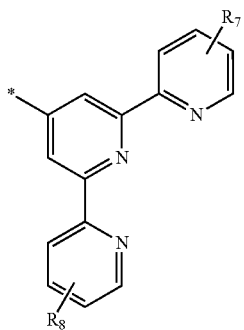

B2
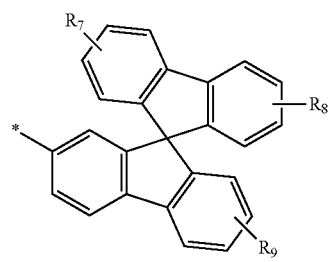

B3
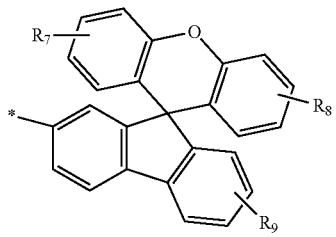

B4
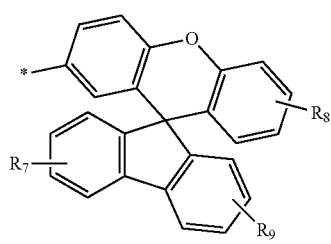

B5
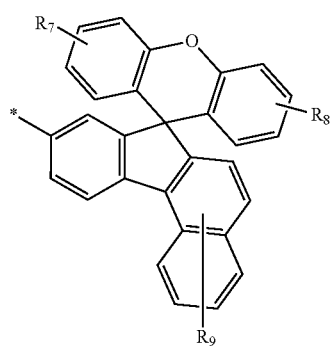

-continued

B6
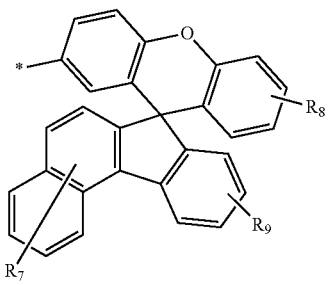

B7
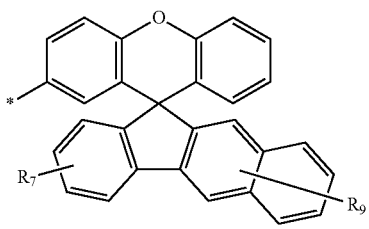

B8
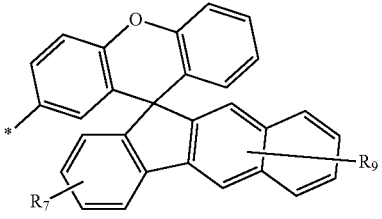

Hereinafter, the chemical formulas B1 to B8 will be described.

* is a position combined with L1 of the chemical formula 2.

$R_7$ and R9, which are same or different, are each independently one selected from the group consisting of a hydrogen; a deuterium; a tritium; a halogen; a cyano group; a nitro group; a $C_6$~$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxyl group; and a $C_6$-$C_{30}$ aryloxy group.

In other examples, $R_7$ and R9, which are same or different, are each independently one selected from the group consisting of a hydrogen; a deuterium; and a tritium.

Since The second layer 222c, 322c, 422c can include any one of the above mentioned chemical formulas B1 to B8, the organic electric device can have high efficiency or long life.

The compound represented by the chemical formula 2 can be one or more of the following compounds, but the compounds represented by the chemical formula 2 in the embodiments of the present invention are not limited to the following compounds.

-continued
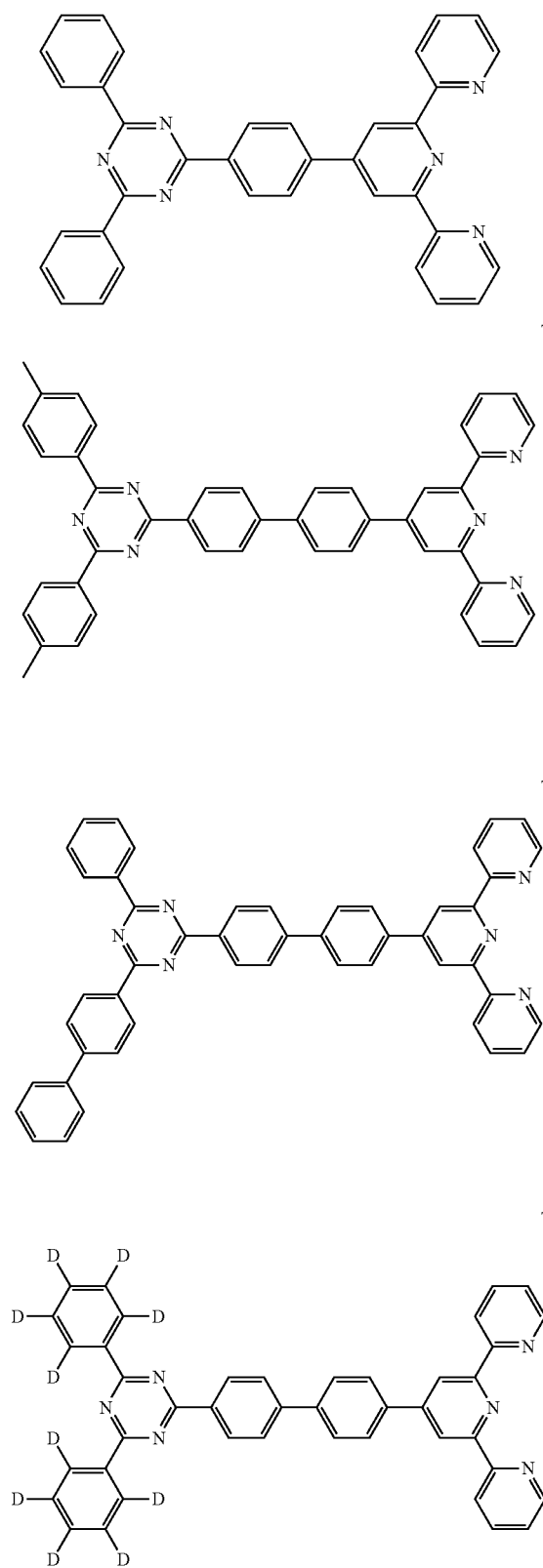
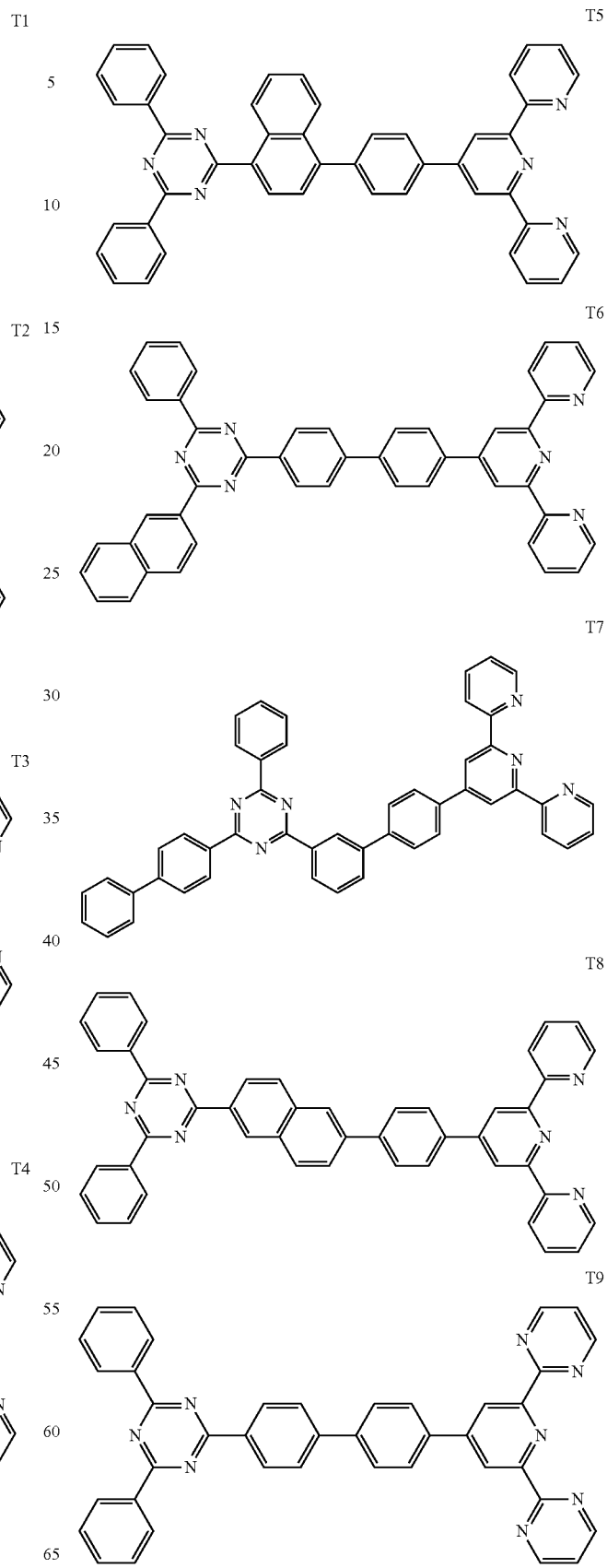

T10

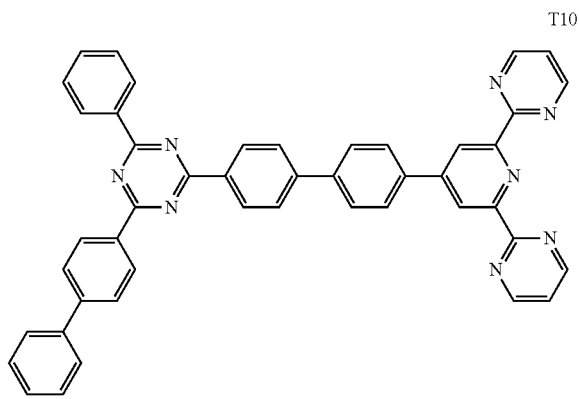

T11

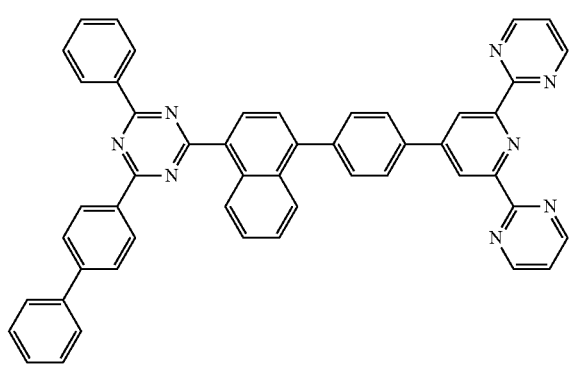

T12

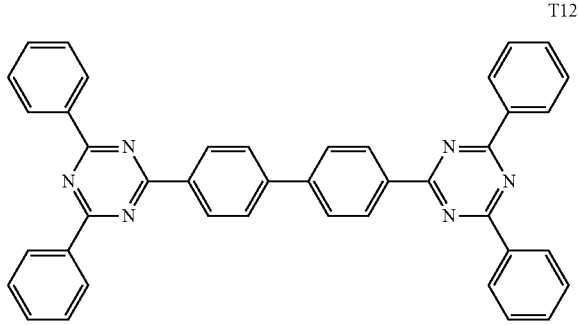

T13

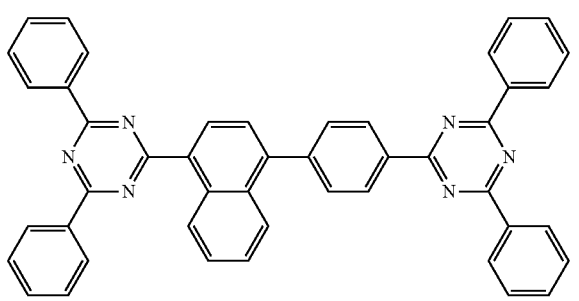

T14

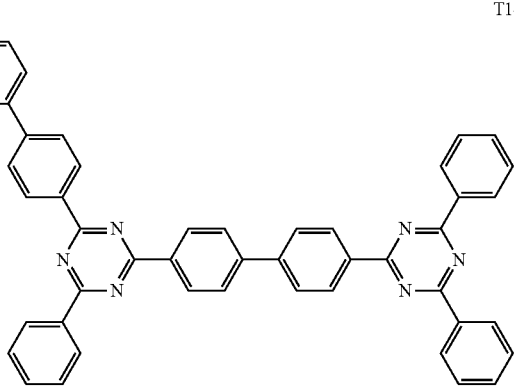

When the second layer 222c, 322c and 422c includes one or more of the above compounds, the organic electric device can have high luminous efficiency or long life.

Other embodiments of the present invention can provide a display panel 110.

The display panel 110 includes a sub-pixel 111 including one of the above-described organic electric elements 220, 320, and 420.

In the display panel 110 according to the present embodiment, since the organic electrical elements 220, 320, and 420 are the same as the organic electrical elements 220, 320, and 420 according to the above-described embodiments, a description thereof will be omitted.

In addition, since the display panel 110 and the sub-pixel 111 according to the embodiments have been described above, a description thereof will be omitted.

Other embodiments of the present invention can provide a display device 100.

The display device 100 includes the above-described display panel 110 and a driving circuit for driving the above-described display panel 110.

In the display device 100 according to the present embodiments, the display panel 110 is the same as the display panel 110 according to the above-described embodiments, so a description thereof will be omitted.

In addition, since the driving circuit for driving the display panel according to embodiments has been described above, a description thereof will be omitted.

Hereinafter, examples of manufacturing an organic electric element according to the embodiments will be specifically described with reference to the embodiment, but the embodiments are not limited to the following examples.

Hereinafter, Synthesis examples of the compound represented by the chemical formula 1 and the compound represented by the chemical formula 2 and examples of manufacturing an organic electric element according to the embodiments will be specifically described with reference to the embodiment, but the embodiments are not limited to the following examples.

Synthesis Examples

The compounds represented by Chemical Formula 1 according to the embodiments of the present invention can be prepared by the following Reaction Formula 1, but the method for preparing the compounds represented by Chemical Formula 1 is not limited thereto.

<Reaction scheme 1>

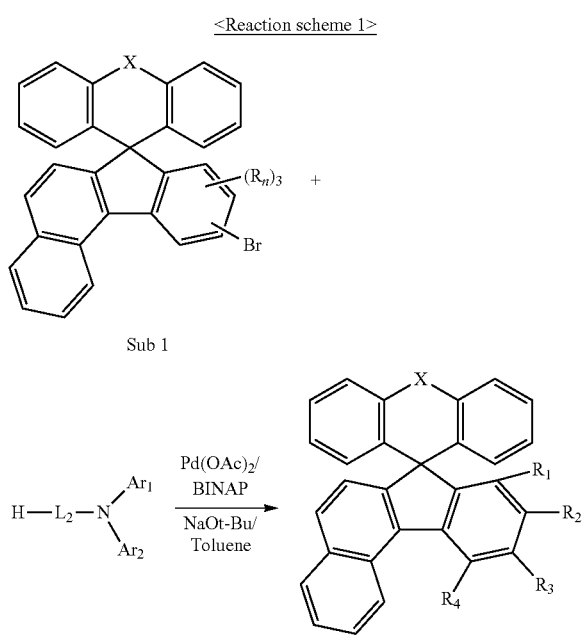

Sub 1

In the reaction scheme 1, $R_n$ is three of $R_1$ to $R_4$ (for example, R1, R2, R3), and X, $R_1$ to $R_4$, $L_2$, $Ar_1$ and $Ar_2$ are described above for the compounds represented by the chemical Formula 1.

Synthesis of Sub 1-a2

An exemplary synthesis method of Sub 1-a2 corresponding to Sub 1 of the reaction scheme 1 is as follows.

<Reaction scheme 2>

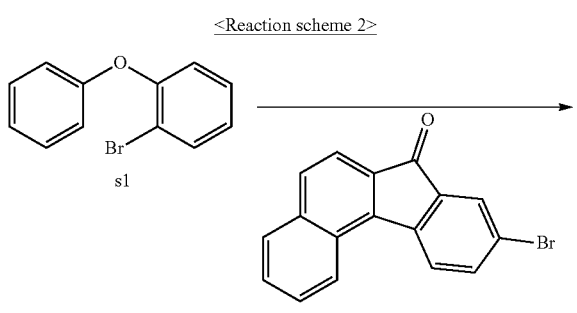

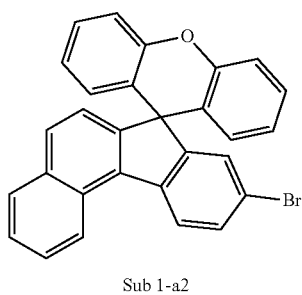

Sub 1-a2

In a round bottom flask, 1g of Mg (0.04M), 0.1 g of Iodine and 20 ml of THF (tetrahydrofuran) are added and stirred at room temperature for 30 minutes. To this solution, 1-bromo-2-phenoxybenzene (s1, 0.04M) was dissolved in 30 ml of the THF. After stirring for 12 hours, 11.2 g of 9-bromo-7H-benzo[c]fluoren-7-one (s2, 0.04M) was dissolved in 100 ml of THF and then stirred for 8 hours.

A 10% $NH_4Cl$ aqueous solution was added to the reaction mixture, stirred for 1 hour, and then separated by EA to recover the organic layer and distilled under reduced pressure to obtain 14.3 g of intermediate a1. To the round bottom flask, 14.3 g of a1 (0.03M), 150 ml of acetic acid, and 0.5 ml of hydrochloric acid (35%) were added, heated to 100° C., and stirred for 2 hours. When the reaction solution is poured into distilled water, crystals precipitate and the precipitate is filtered. The filtrate was dissolved in 100 ml of MC (methylene chloride), dried with $MgSO_4$, and reprecipitated using the MC and ethanol to obtain 10.8 g of Sub 1-a2.

Synthesis of SBX2

<Reaction scheme 3>

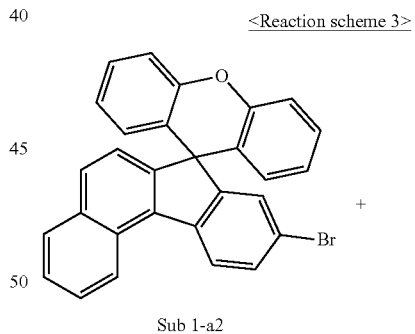

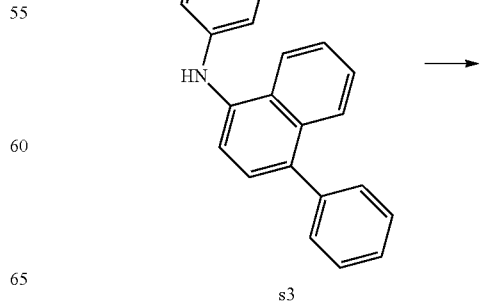

-continued

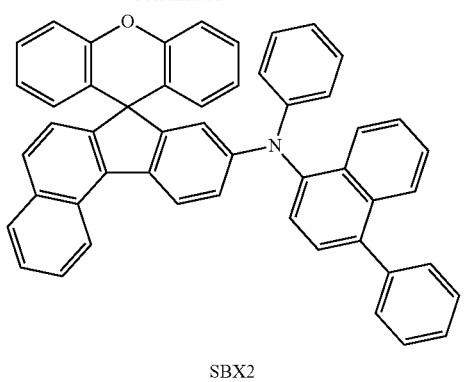

SBX2

In a round bottom flask, 3 g of Sub 1-a2 (0.007M), 2.3 g of N,4-diphenylnaphthalen-1-amine (s3, 0.008M), 0.03 g of palladium acetate (II), 0.1 g of 2,2'-Bis(Diphenylphosphino)-1,1'-binaphthyl, 0.9 g of Sodium-t-Butoxide, 30 ml of Toluene is added and heated to 100° C. and stirred for 8 hours.

The reaction solution is filtered through silicagel to remove impurities, and the filtrate is concentrated under reduced pressure to obtain a crude product. The obtained crude was reprecipitated through MC/Acetone to obtain 3.3 g of SBX2.

Synthesis of SBX4

<Reaction scheme 4>

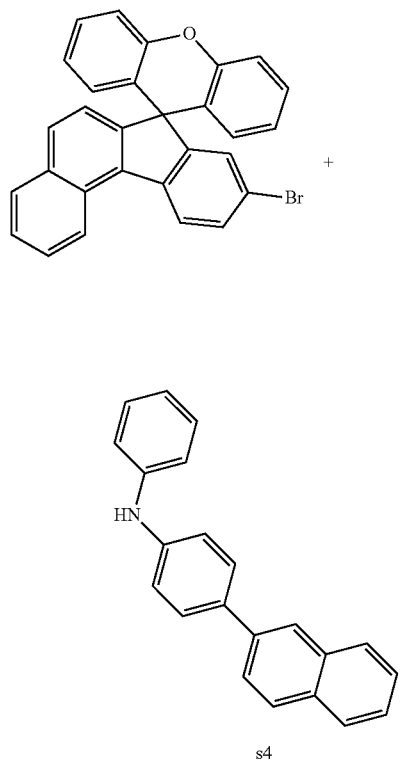

s4

-continued

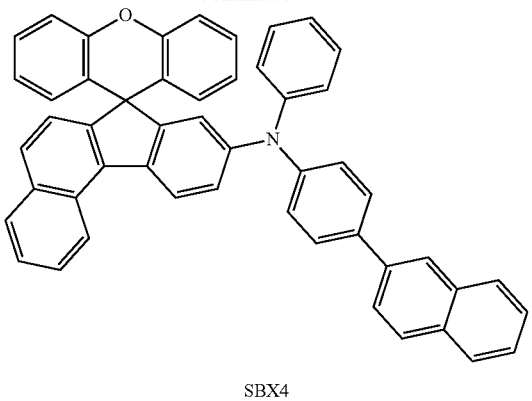

SBX4

In the synthesis method of SBX2, 3.8 g of SBX 4 was obtained by proceeding in the same synthesis method except that s4 was used instead of s3.

Synthesis of SBX5

<Reaction scheme 5>

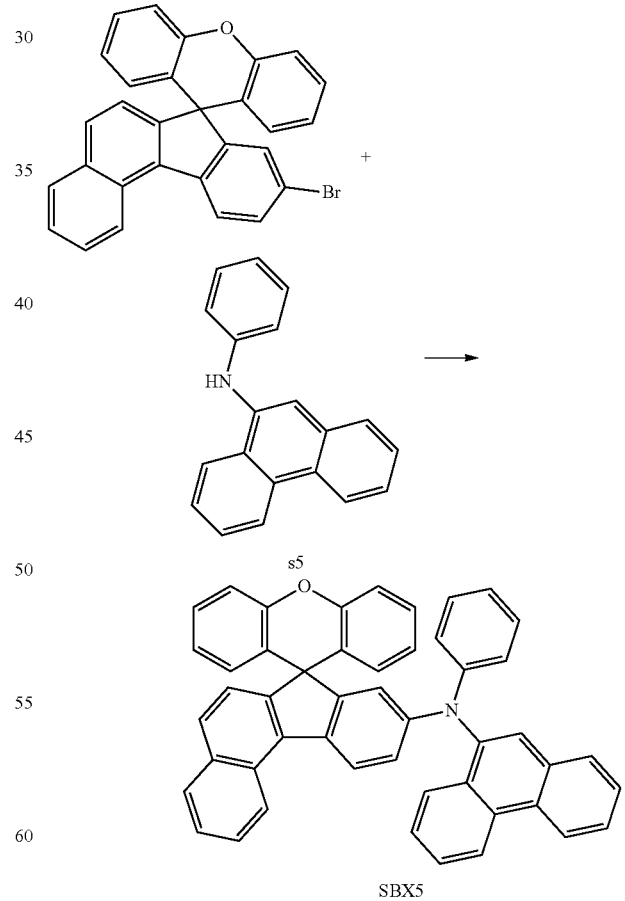

s5

SBX5

In the synthesis method of SBX2, 4.0 g of SBX 5 was obtained by proceeding with the same synthesis method except that s5 was used instead of s3.

Synthesis of SBX8

<Reaction scheme 6>

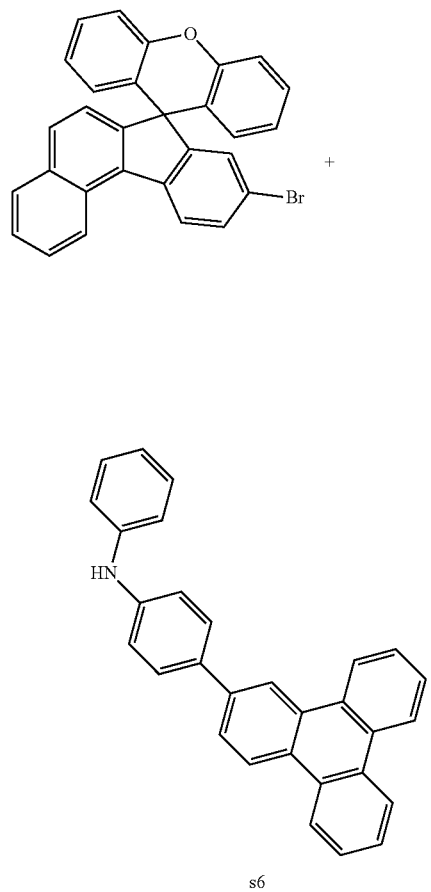

In the synthesis method of SBX2, 3.7 g of SBX 8 was obtained by proceeding with the same synthesis method except that s6 was used instead of s3.

Synthesis of SBX12

<Reaction scheme 7>

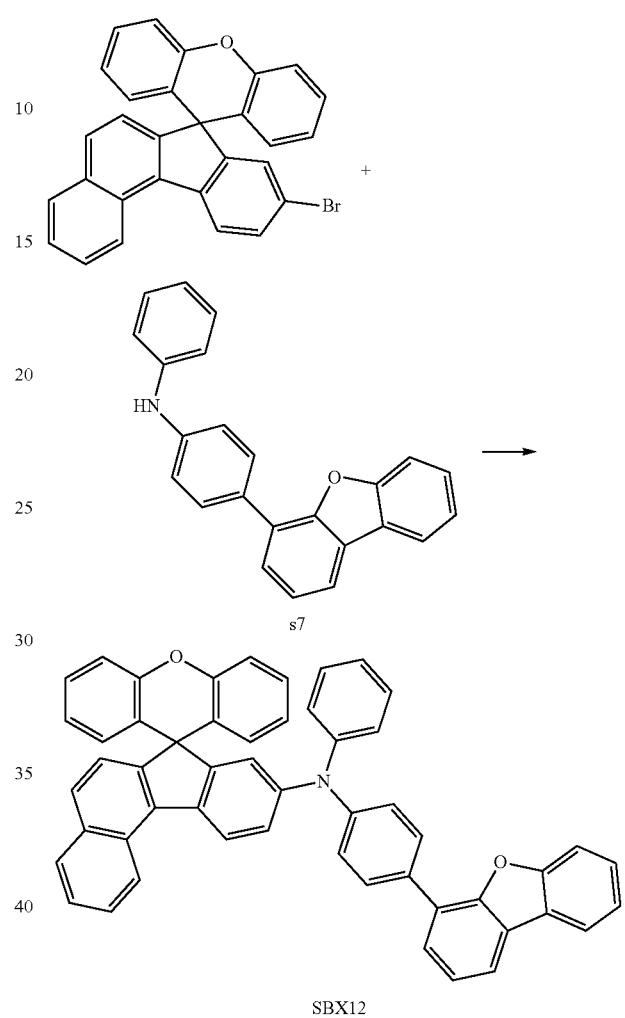

In the synthesis method of SBX2, 3.3 g of SBX 12 was obtained by proceeding with the same synthesis method except that s7 was used instead of s3.

Synthesis of SBX15

<Reaction scheme 8>

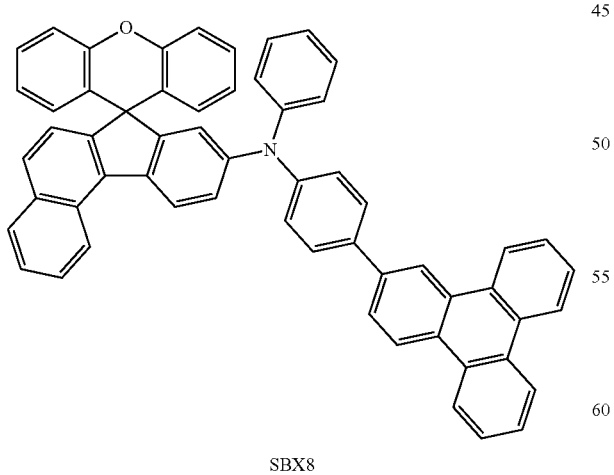

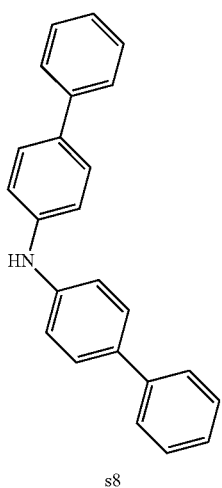
s8
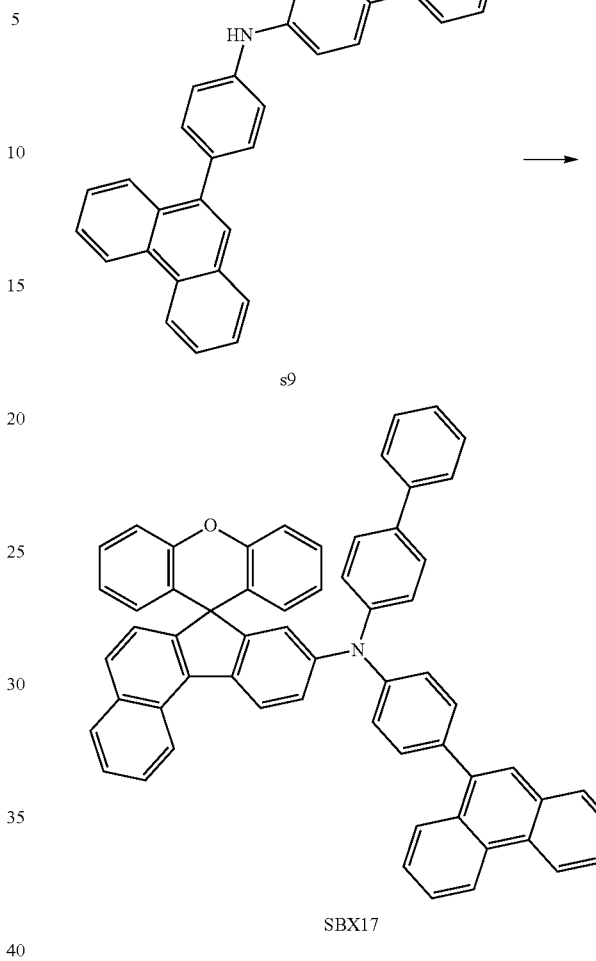
s9
SBX15
SBX17
In the synthesis method of SBX2, 3.3 g of SBX 15 was obtained by proceeding with the same synthesis method except that s8 was used instead of s3.
Synthesis of SBX17
<Reaction scheme 9>
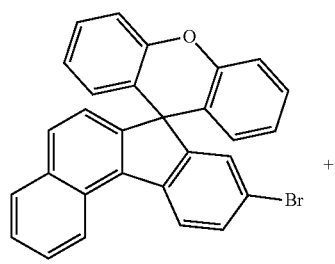
+
In the synthesis method of SBX2, 4.0 g of SBX 17 was obtained by proceeding with the same synthesis method except that s9 was used instead of s3.
Synthesis of SBX19
<Reaction scheme 10>
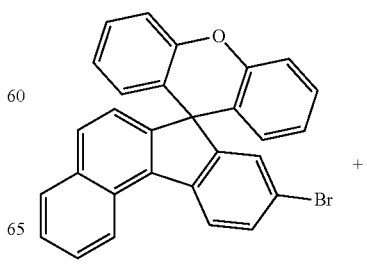
+

43

-continued

44

-continued

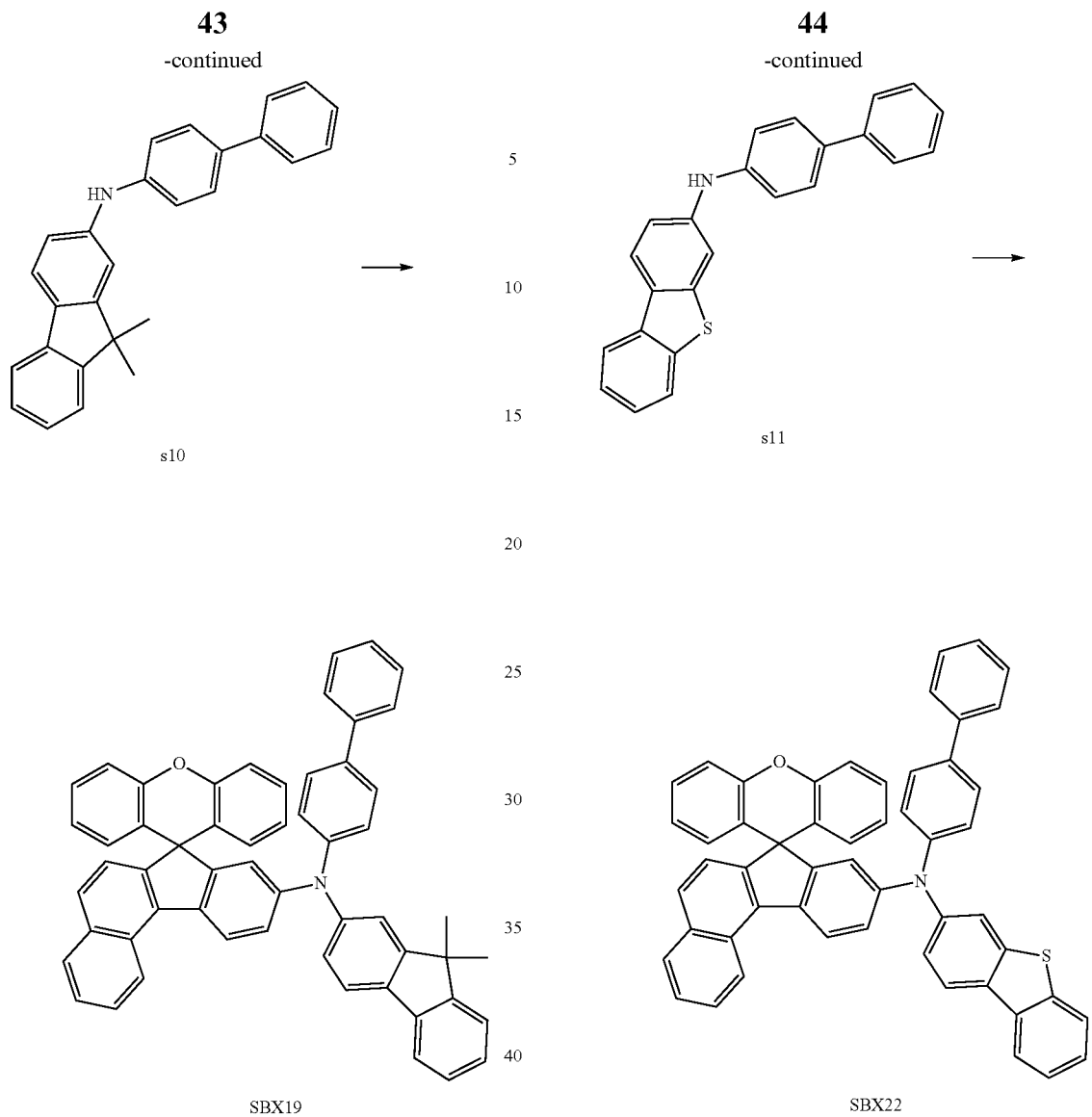

s10 s11

SBX19

SBX22

In the synthesis method of SBX2, 3.5 g of SBX 19 was obtained by proceeding with the same synthesis method except that s10 was used instead of s3.

In the synthesis method of SBX2, 3.8 g of SBX 22 was obtained by proceeding in the same synthesis method except that s11 was used instead of s3.

Synthesis of SBX22

Synthesis of SBX28

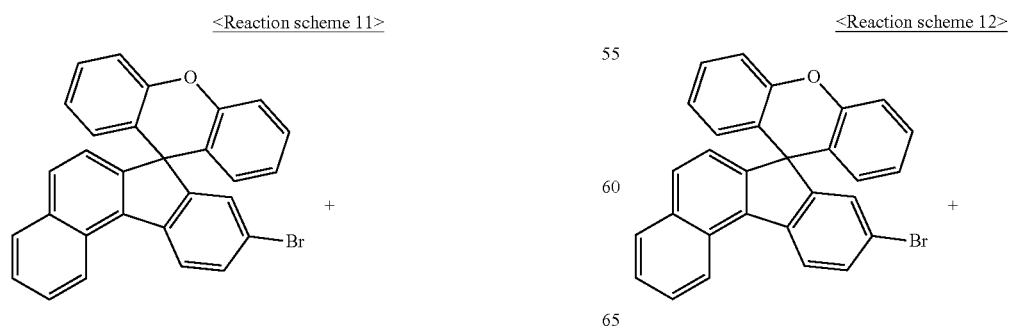

<Reaction scheme 11>

<Reaction scheme 12>

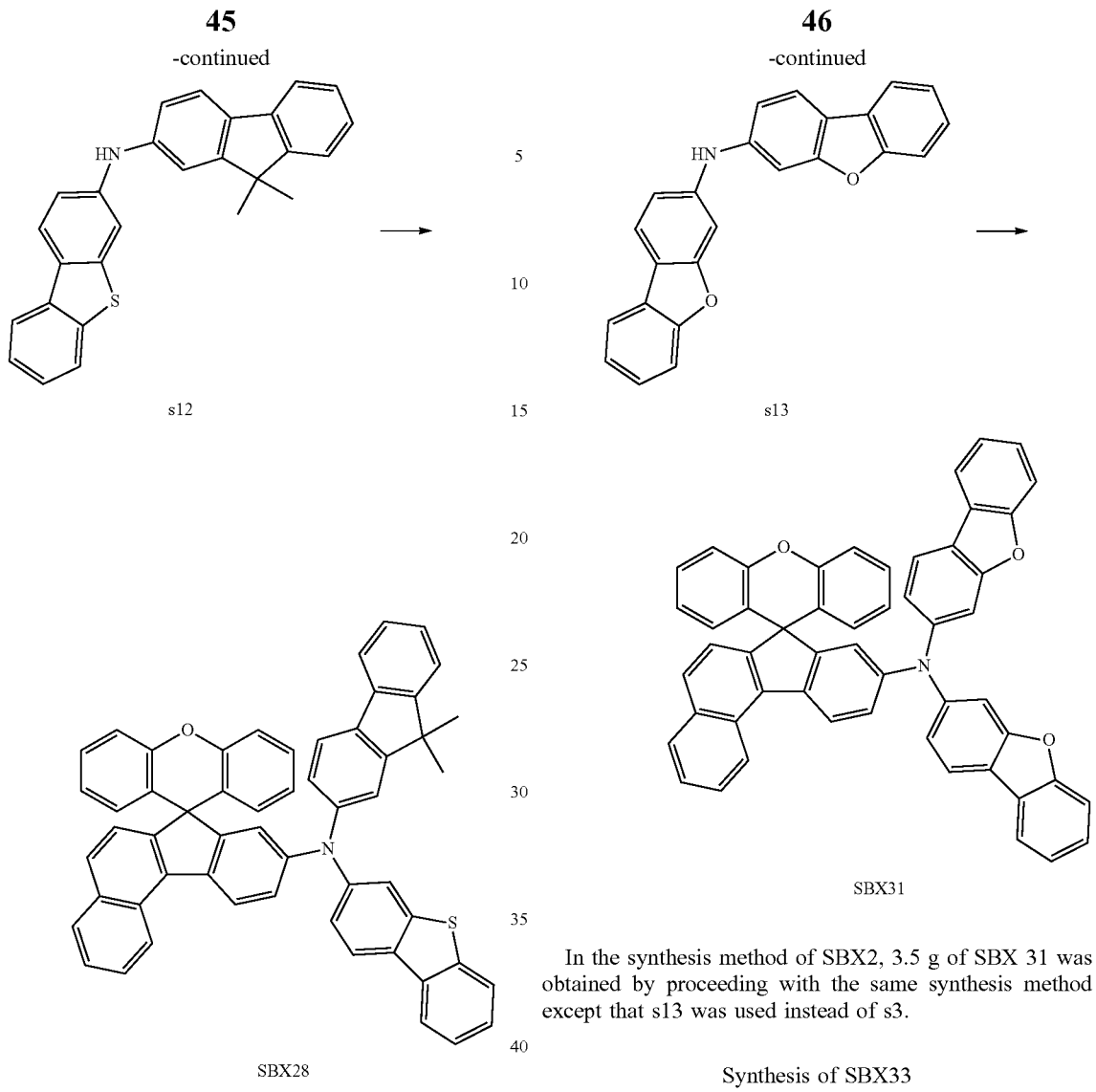
s12
SBX28
In the synthesis method of SBX2, 3.8 g of SBX 28 was obtained by proceeding with the same synthesis method except that s12 was used instead of s3.
Synthesis of SBX31
<Reaction scheme 13>
s13
SBX31
In the synthesis method of SBX2, 3.5 g of SBX 31 was obtained by proceeding with the same synthesis method except that s13 was used instead of s3.
Synthesis of SBX33
<Reaction scheme 14>
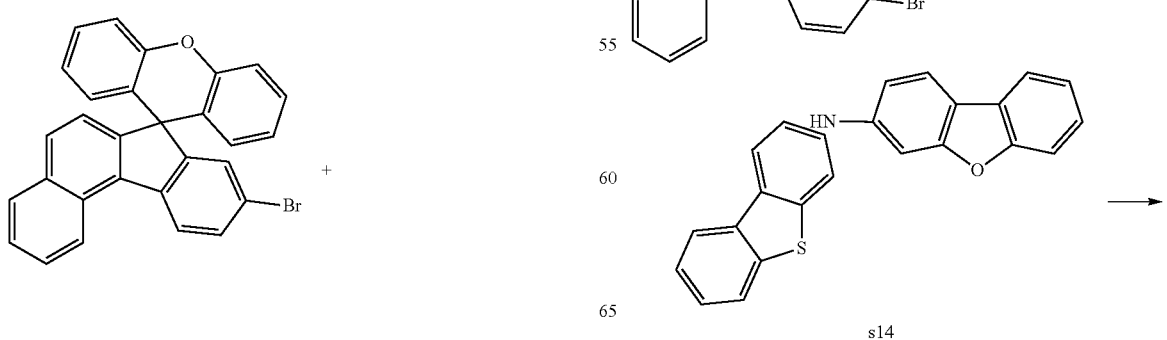
s14

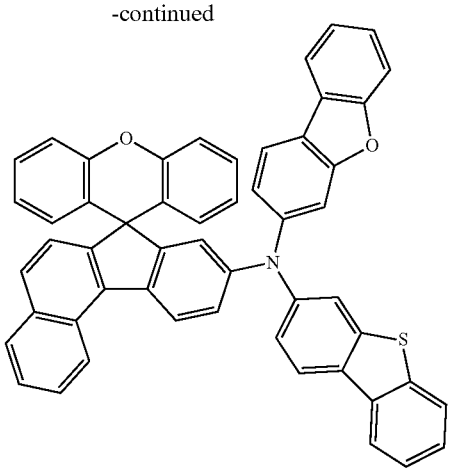

SBX33

In the synthesis method of SBX2, 3.5 g of SBX 33 was obtained by proceeding with the same synthesis method except that s14 was used instead of s3.

Synthesis of Sub 1-a4

<Reaction scheme 15>

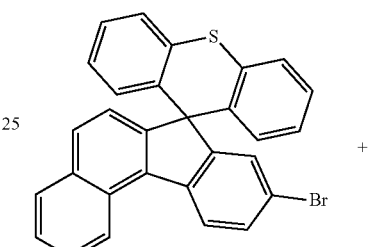

In a round bottom flask, 1g of Mg (0.04M), 0.1 g of Iodine and 20 ml of THF (tetrahydrofuran) are added and stirred at room temperature for 30 minutes. To this solution, (2-bromophenyl)(phenyl)sulfane (s1, 0.04M) was dissolved in 30 ml of the THF. After stirring for 12 hours, 10.5 g of 9-bromo-7H-benzo[c]fluoren-7-one (s2, 0.04M) was dissolved in 100 ml of THF and then stirred for 8 hours.

In the round bottom flask, 13.2 g of a3 (0.03M), 150 ml of acetic acid, and 0.5 ml of hydrochloric acid (35%) were added, heated to 100° C., and stirred for 2 hours. When the reaction solution is poured into distilled water, crystals precipitate and the precipitate is filtered. The filtrate was dissolved in 100 ml of MC (methylene chloride), dried with MgSO$_4$, and reprecipitated using the MC and ethanol to obtain 10.0 g of Sub 1-a4.

Synthesis of SBX39

<Reaction scheme 16>

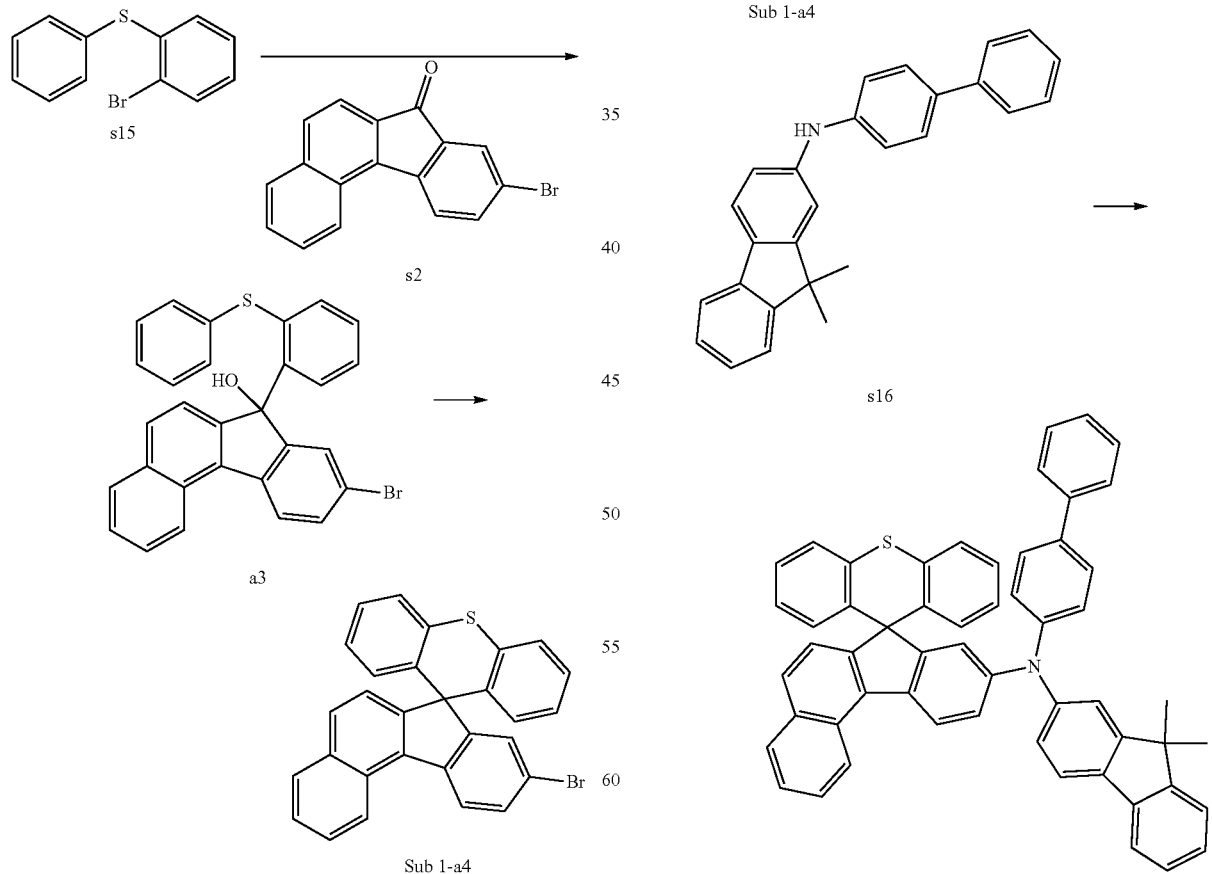

In a round bottom flask, 3 g of Sub 1-a4 (0.006M), 2.7 g of 516, 0.03 g of palladium acetate(II), 0.1 g of 2,2'-Bis (Diphenylphosphino)-1,1'-binaphthyl, 0.9 g of Sodium-t-Butoxide, 30 ml of Toluene is added and heated to 100° C. and stirred for 8 hours.

The reaction solution is filtered through silicagel to remove impurities, and the filtrate is concentrated under reduced pressure to obtain a crude product. The obtained crude was reprecipitated through MC/Acetone to obtain 3.9 g of SBX39

The compounds represented by the chemical formula 2 according to the embodiments can be prepared by the following Reaction Scheme 17, but the method for preparing the compounds represented by the chemical formula 2 is not limited thereto.

<Reaction scheme 17>

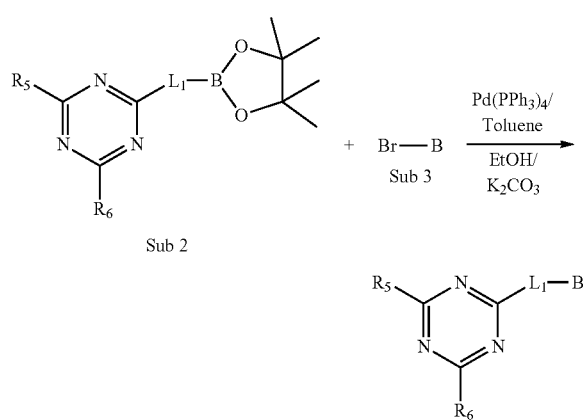

In the reaction scheme 17, B of Sub 2 is boron, B of Sub 3 is B of the chemical formula 2, and B of $R_5$, $R_6$, $L_1$, and Sub 3 are described above for the compounds represented by the chemical Formula 2.

Synthesis of T3

<Reaction scheme 18>

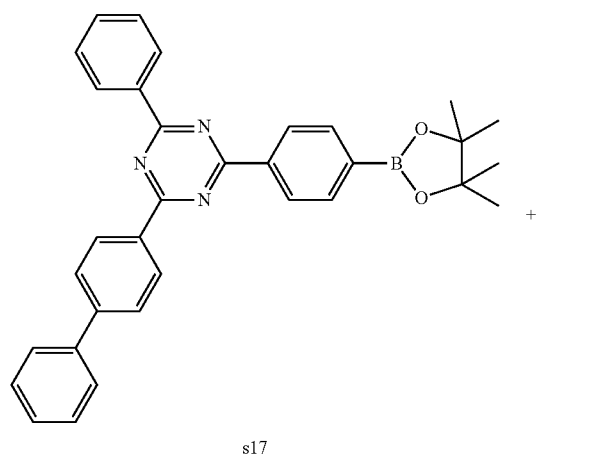

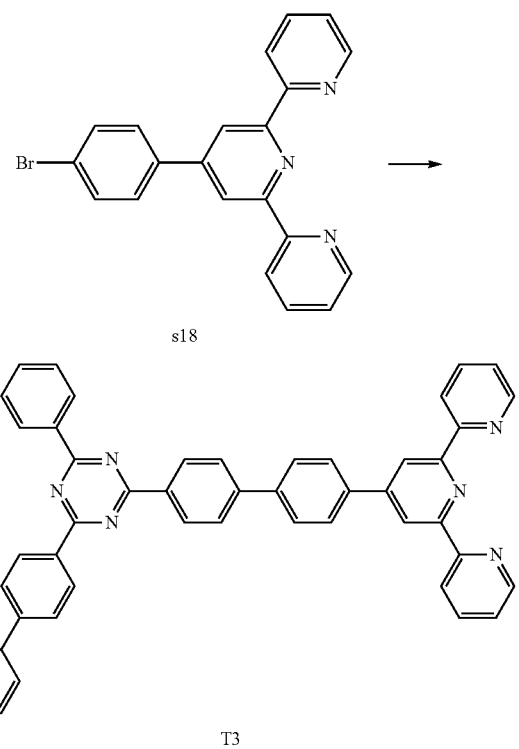

In a round-bottom flask, 5 ml of s17 (10 mmol), 4.6 g of s18 (12 mmol), 0.5 g of Tetrakis (triphenylphosphine)palladium (0) (0.3 mmol), 100 ml of Toluene, 15 ml of EtOH, 10 ml of 2M $K_2CO_3$ were added and stirred under reflux for 12 hours. After completion of the reaction, the reaction solution is filtered to obtain a crude product. The filtered crude is heated and dissolved in $CHCl_3$, filtered under reduced pressure in $Al_2O_3$ and concentrated to recrystallize. 3.7 g of T3 was obtained.

Synthesis of T10

<Reaction scheme 19>

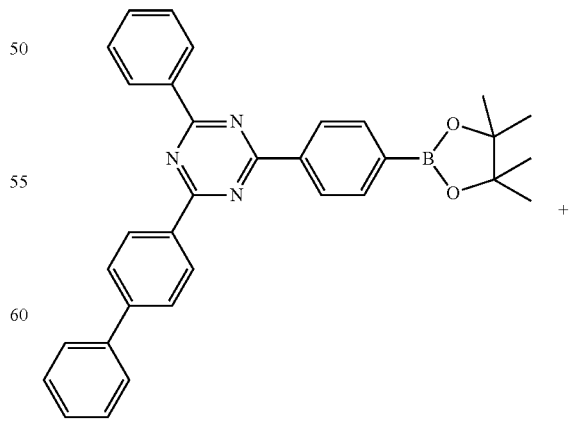

-continued

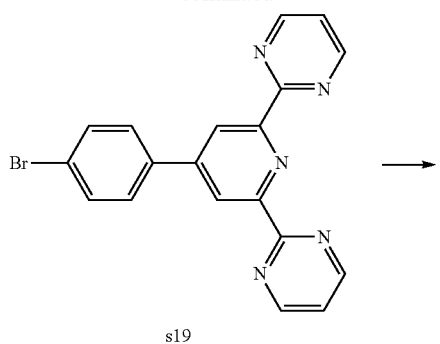

s19

-continued

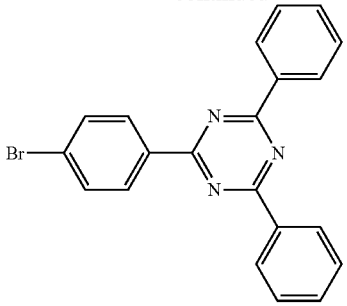

s20

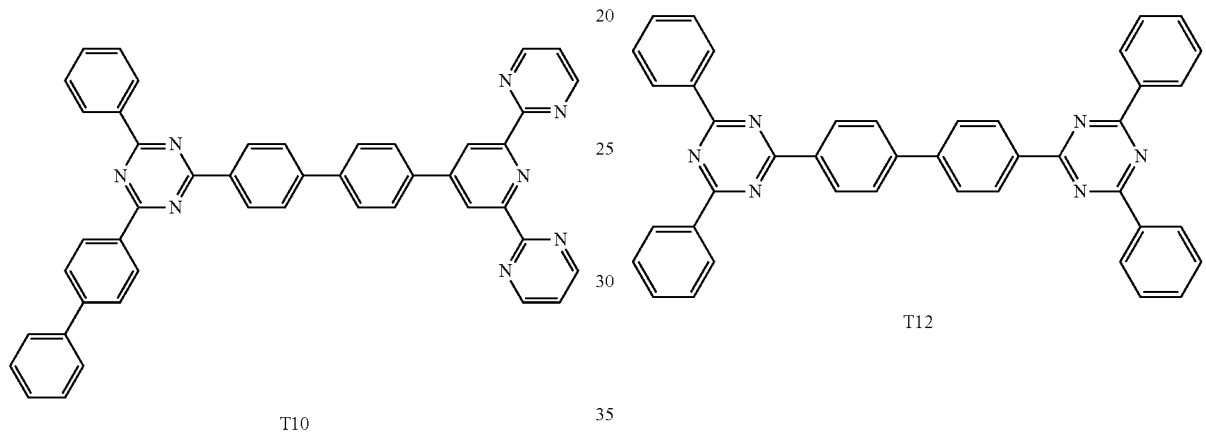

T10

T12

In the synthesis method of T3, 3.5 g of T10 was obtained by proceeding with the same synthesis method except that s19 was used instead of s18.

In the synthesis method of T3, 3.9 g of T12 was obtained by proceeding with the same synthesis method except that s20 was used instead of s18.

Synthesis of T12

Manufacturing Evaluation of Organic Electric Element

<Reaction scheme 20>

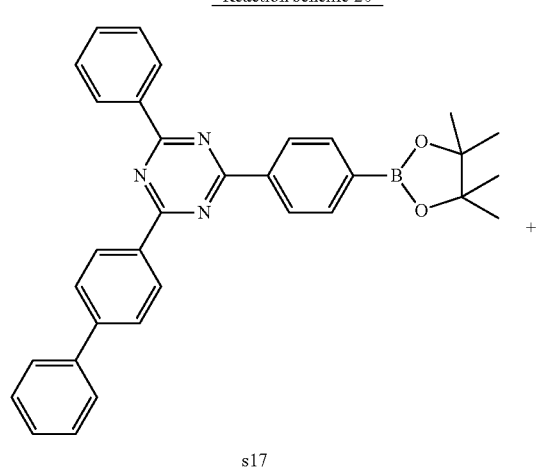

s17

Embodiment 1

After washing a glass substrate coated with ITO (indium tin oxide) to a thickness of 1,000 Å, the substrate is washed with a solvent such as isopropyl alcohol, acetone or methanol and dried. On this prepared ITO transparent electrode, a HIL-1 material as a hole injection material is thermally vacuum-deposited to form a hole injection layer of 5 nm and then the compound of the SBX 15 material is thermally vacuum-deposited to the thickness of 80 nm.

Subsequently, BH-1 and BD-1 were doped 5% as a host and a dopant material of a light emitting layer, respectively, and thermal vacuum deposition was performed to a thickness of 30 nm. Subsequently, a T3 (30 nm) compound was thermally vacuum-deposited as a material for the electron transport layer and the electron injection layer, respectively, and then 4 nm of LiF and 100 nm of Al were deposited to form a cathode, thereby fabricating an organic electric device.

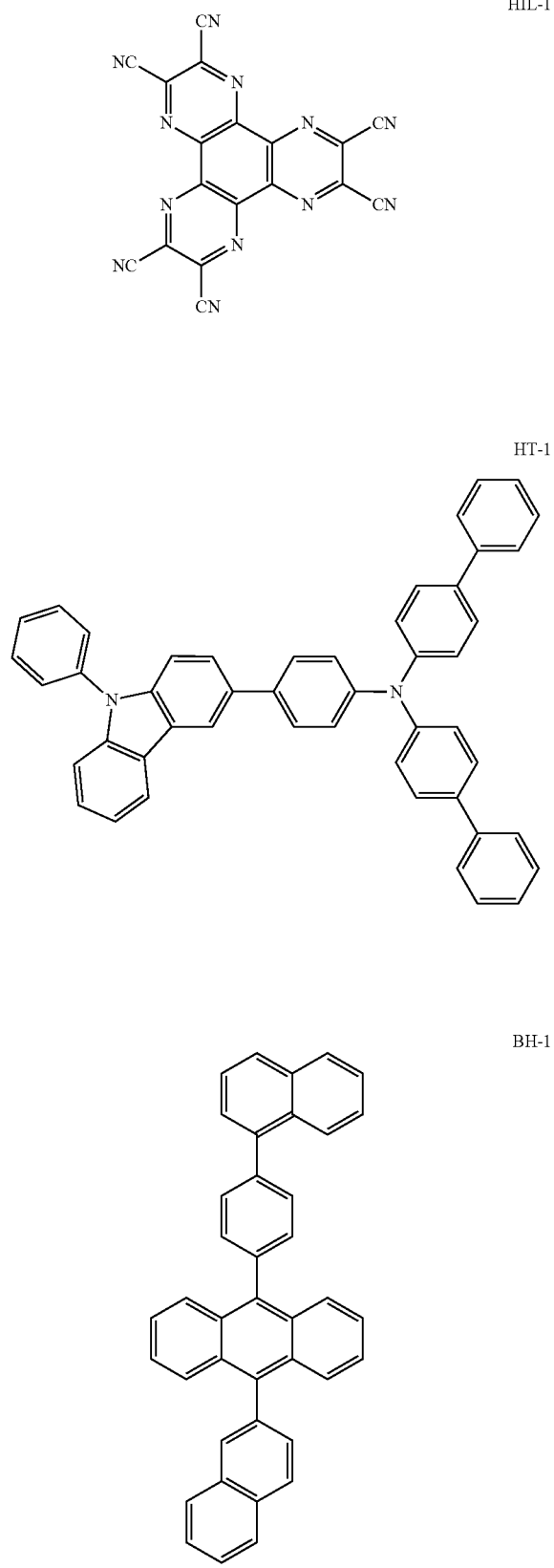
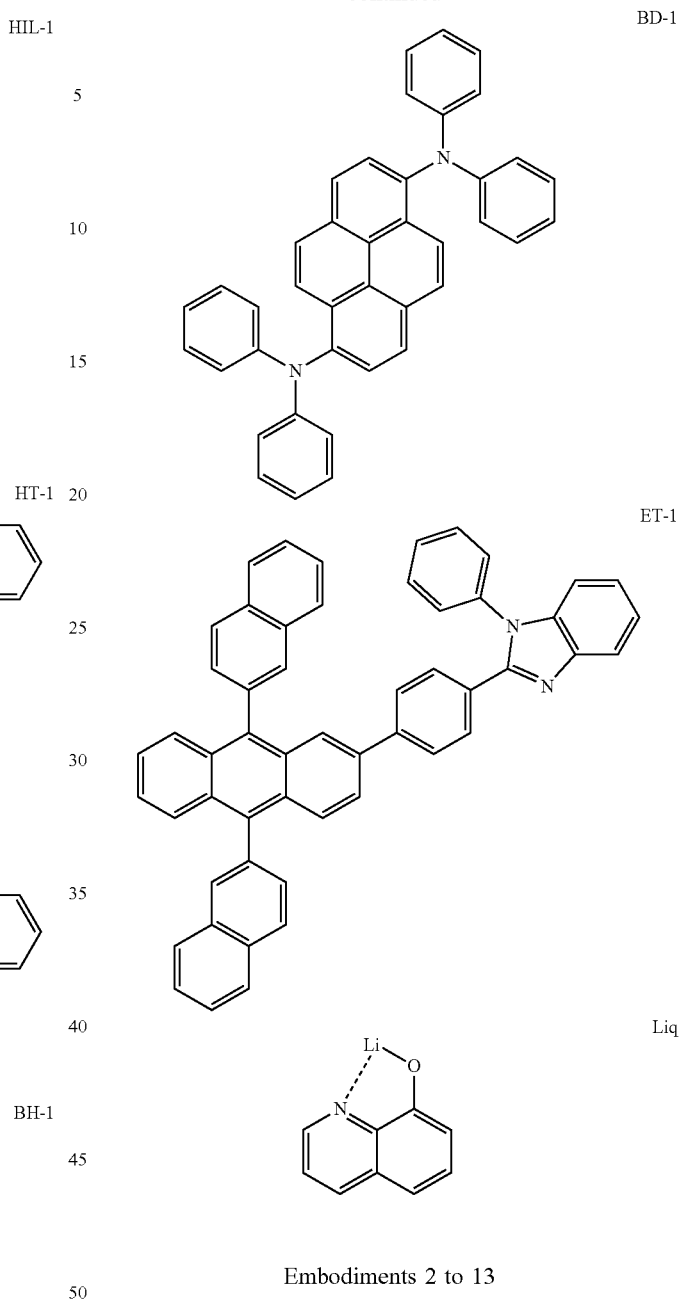

Embodiments 2 to 13

The organic electric element was manufactured in the same manner as in the embodiment 1, except that the compound shown in Table 1 was used instead of the SBX15 compound as the hole transport material.

Embodiments 14 and 15

The organic electric element was manufactured in the same manner as in the embodiment 1, except that the compound shown in Table 1 was used instead of the SBX15 compound as the hole transport material and the T9 compound was used as the electron transport material.

Embodiments 16 and 17

The organic electric element was manufactured in the same manner as in the embodiment 1, except that the compound shown in Table 1 was used instead of the SBX15 compound as the hole transport material and the T12 compound was used as the electron transport material.

ComparativeExample 1

The organic electric element was manufactured in the same manner as in the embodiment 1, except that the HT-1 compound was used instead of the SBX15 compound as the hole transport material and the ET-1 compound was used instead of the T3 as the electron transport material.

Table 1 shows the performances of the manufactured organic electric elements.

TABLE 1

|  | HTL | ETL | Op. V | efficiency Cd/A | CIEx | CIEy | LT95 (hr) |
|---|---|---|---|---|---|---|---|
| Comparative Example 1 | HT-1 | ET-1 | 4.64 | 100% | 0.141 | 0.051 | 100% |
| Embodiment 1 | SBX2 | T3 | 4.43 | 98% | 0.141 | 0.052 | 110% |
| Embodiment 2 | SBX4 | T3 | 4.38 | 99% | 0.141 | 0.049 | 112% |
| Embodiment 3 | SBX5 | T3 | 4.52 | 103% | 0.141 | 0.050 | 118% |
| Embodiment 4 | SBX8 | T3 | 4.54 | 103% | 0.141 | 0.050 | 122% |
| Embodiment 5 | SBX12 | T3 | 4.31 | 104% | 0.141 | 0.050 | 115% |
| Embodiment 6 | SBX15 | T3 | 4.25 | 98% | 0.141 | 0.052 | 120% |
| Embodiment 7 | SBX17 | T3 | 4.30 | 101% | 0.141 | 0.050 | 107% |
| Embodiment 8 | SBX19 | T3 | 4.13 | 102% | 0.142 | 0.048 | 128% |
| Embodiment 9 | SBX22 | T3 | 4.18 | 101% | 0.142 | 0.048 | 133% |
| Embodiment 10 | SBX28 | T3 | 4.26 | 105% | 0.140 | 0.049 | 115% |
| Embodiment 11 | SBX31 | T3 | 4.32 | 104% | 0.141 | 0.050 | 128% |
| Embodiment 12 | SBX33 | T3 | 4.36 | 102% | 0.142 | 0.050 | 115% |
| Embodiment 13 | SBX39 | T3 | 4.20 | 104% | 0.140 | 0.048 | 106% |
| Embodiment 14 | SBX19 | T10 | 4.15 | 105% | 0.141 | 0.049 | 133% |
| Embodiment 15 | SBX22 | T10 | 4.20 | 105% | 0.141 | 0.051 | 129% |
| Embodiment 16 | SBX19 | T12 | 4.10 | 103% | 0.140 | 0.050 | 142% |
| Embodiment 17 | SBX22 | T12 | 4.11 | 103% | 0.140 | 0.048 | 134% |

As can be seen from the results of Table 1, the organic electric element including the hole transport layer with the compound represented by the chemical formula 1 and the electron transport layer with the compound represented by the chemical formula 2 can have excellent efficiency or lifespan compared to the organic electric element of the Comparative Example 1.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. For example, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. An organic electric element comprising:
a first electrode;
a second electrode; and
an organic layer positioned between the first electrode and the second electrode,
wherein the organic layer comprises an emitting layer, a first layer and a second layer,
the first layer comprises a compound represented by one or more of the following chemical formulas 1-1 to 1-4, and
the second layer comprises a compound represented by the following chemical formula 2,

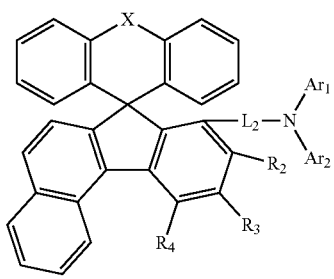

[chemical formula 1-1]

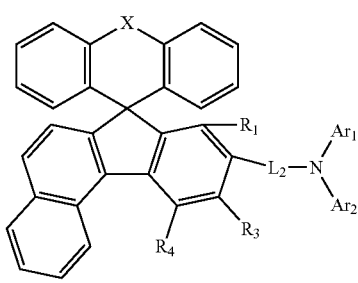

[chemical formula 1-2]

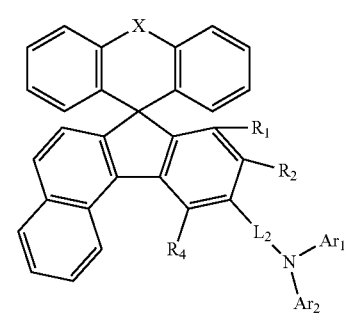

[chemical formula 1-3]

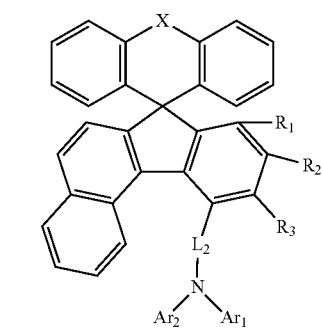

[chemical formula 1-4]

[chemical formula 2]

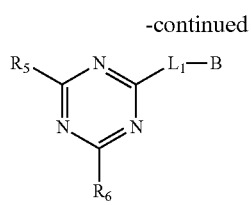

wherein in the chemical formulas 1-1 to 1-4:
X is O, S, or NR,
R is a $C_6$ aryl group,
$R_1$ to $R_4$ are same or different, and are each independently selected from the group consisting of a hydrogen; a deuterium; and a tritium;
$L_2$ is a single bond,
$Ar_1$ and $Ar_2$ are same or different, and are each independently selected from the group consisting of a $C_6$-$C_{60}$ aryl group; a fluorenyl group; and a $C_2$-$C_{60}$ hetero ring group containing at least one hetero atom from O, N, S, Si and P,
wherein in the chemical formula 2:
$R_5$ and $R_6$ are same or different, and are each,
$L_1$ is one selected from the group consisting of a single bond; and a $C_6$-$C_{60}$ arylene group,
B is independently selected from the group consisting of a $C_6$-$C_{60}$ aryl group; a fluorenyl group; and a $C_2$-$C_{60}$ hetero ring group containing at least one hetero atom from O, N, S, Si and P,
wherein in the chemical formulas 1-1, 1-2, 1-3, 1-4 and 2, the aryl group, the fluorenyl group, the hetero ring group, the arylene group and the fluorenylene can each be further substituted with at least one substituent selected from the group consisting of a deuterium; a nitro group; a nitrile group; a cyano group; a halogen; an amino group; a $C_1$-$C_{20}$ alkyl group; a $C_2$-$C_{20}$ alkenyl group; a $C_2$-$C_{20}$ alkynyl group; a $C_6$-$C_{20}$ aryl group; a fluorenyl group; and a $C_2$-$C_{20}$ hetero ring group, and
with the proviso that in the chemical formula 2, $L_1$ does not include the following chemical formulas:

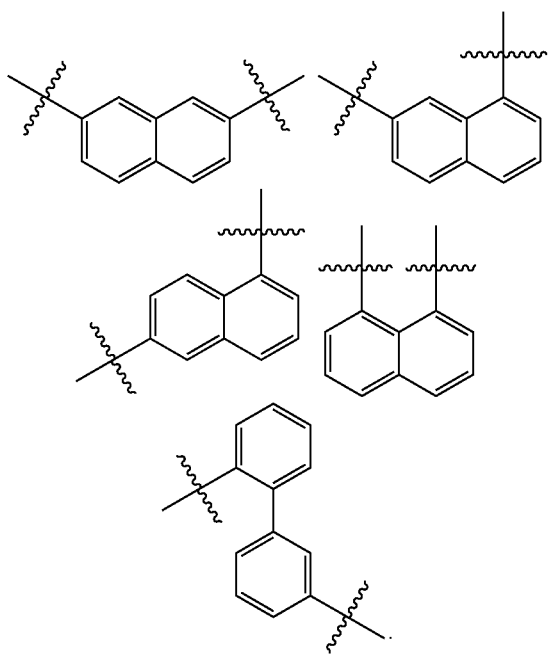

2. The organic electric element according to claim 1, wherein the B in the chemical formula 2 can be any one of the following chemical formulas:

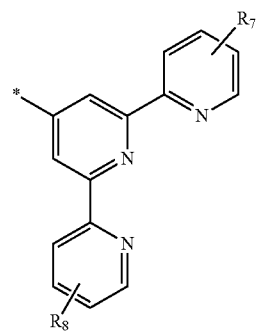
B1

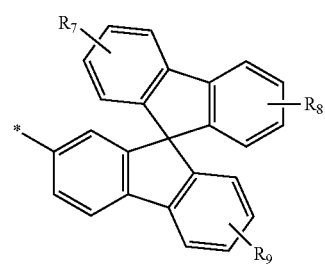
B2

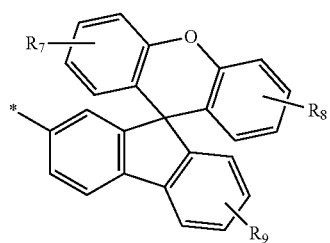
B3

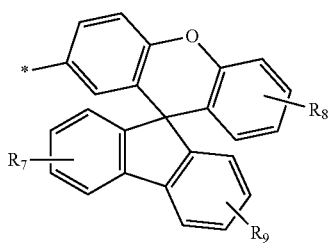
B4

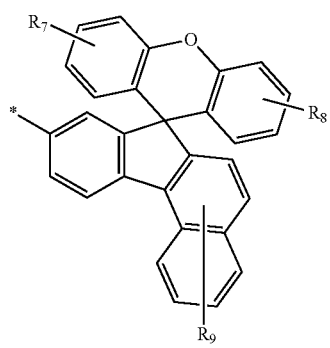
B5

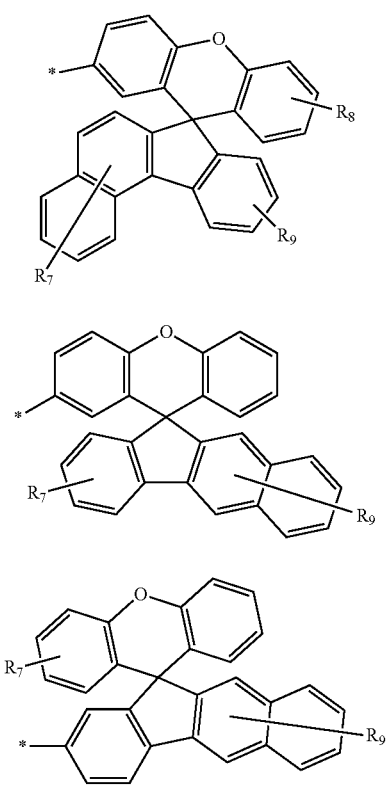

B6

B7

B8 wherein in the chemical formulas B1 to B8:

* is a position combined with $L_1$ of the chemical formula 2, and $R_7$ and $R_9$ are same or different, and are each independently selected from the group consisting of a hydrogen; a deuterium; a halogen; a cyano group; and a nitro group.

3. The organic electric element according to claim 1, wherein the compound represented by the chemical formula 1 is one or more of the following compounds:

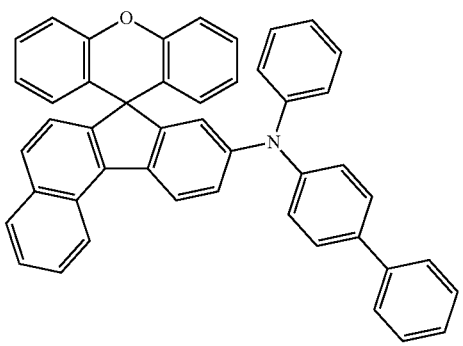

SBX1

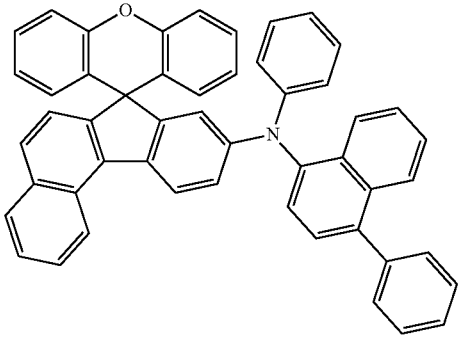

SBX2

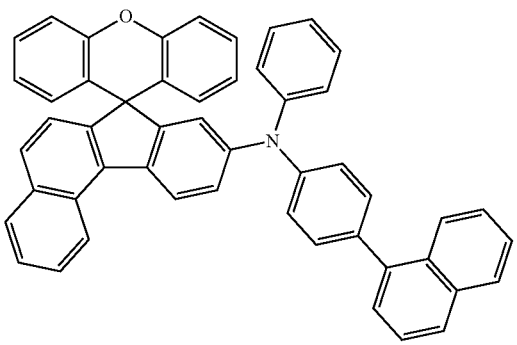

SBX3

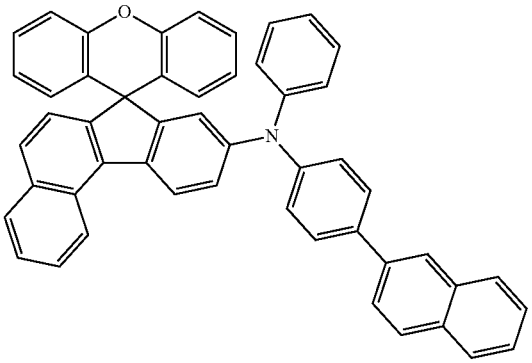

SBX4

SBX5

SBX6
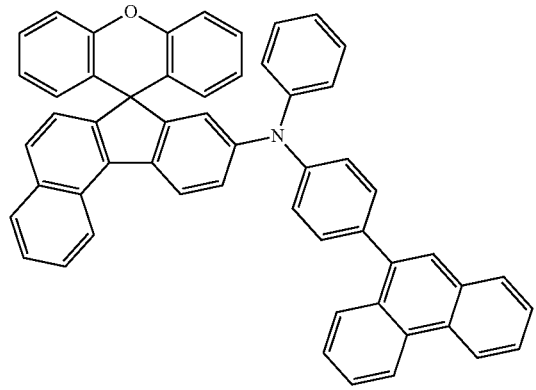
SBX7
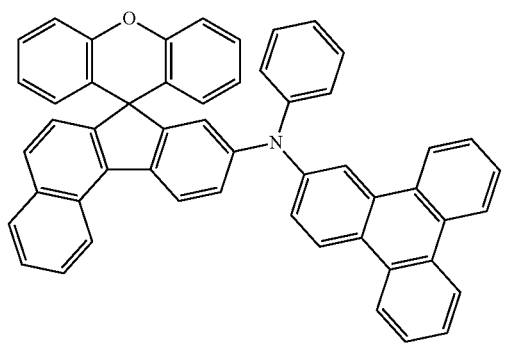
SBX8
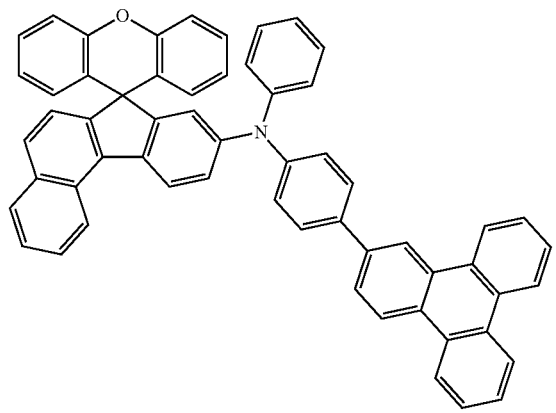
SBX9
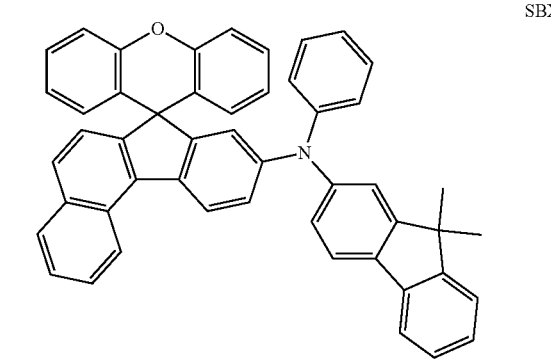
SBX10
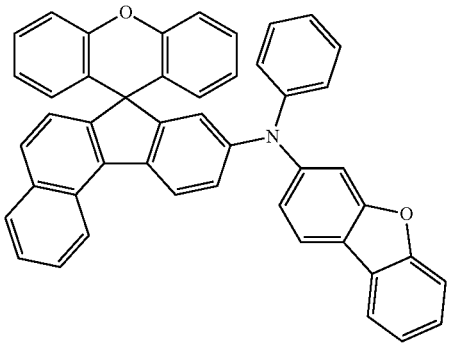
SBX11
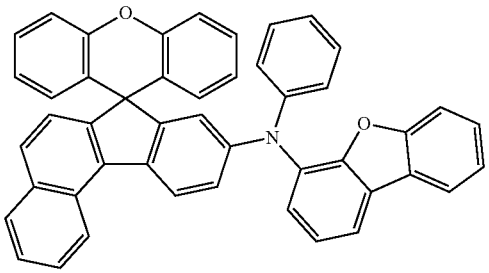
SBX12
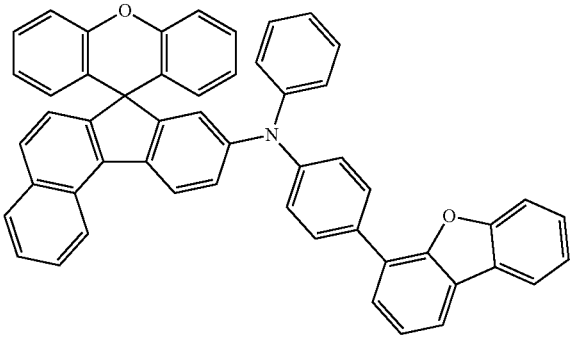
SBX13
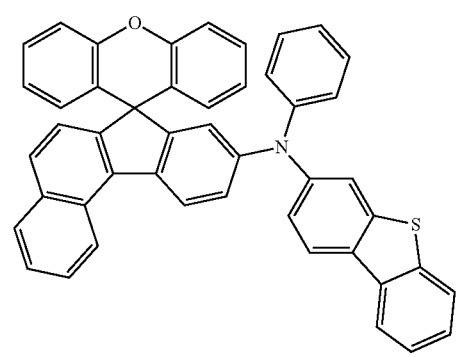
SBX14
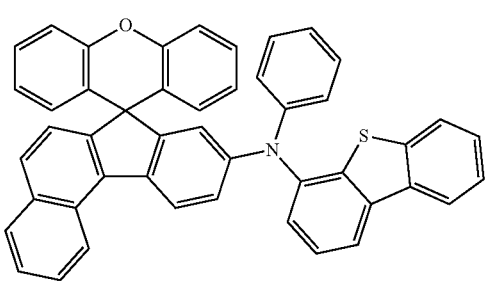

SBX15
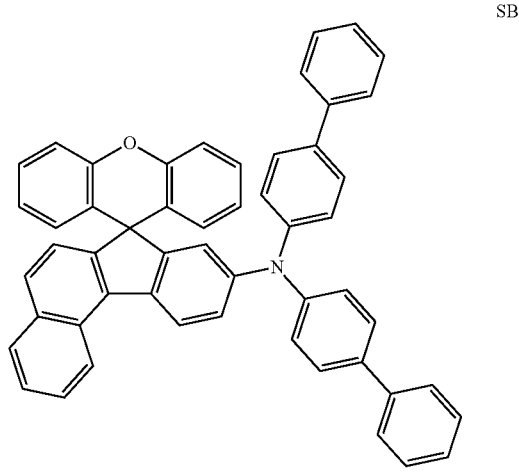
SBX16
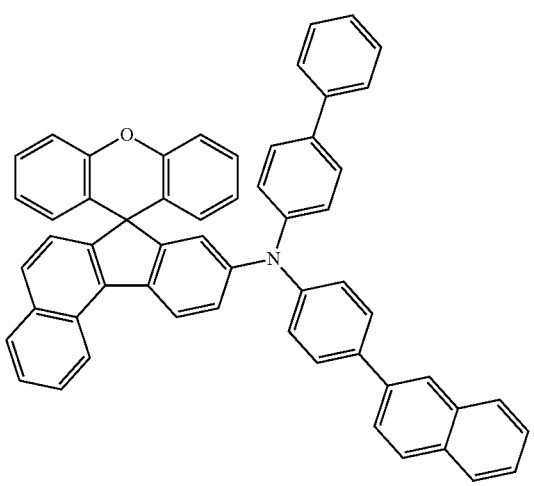
SBX17
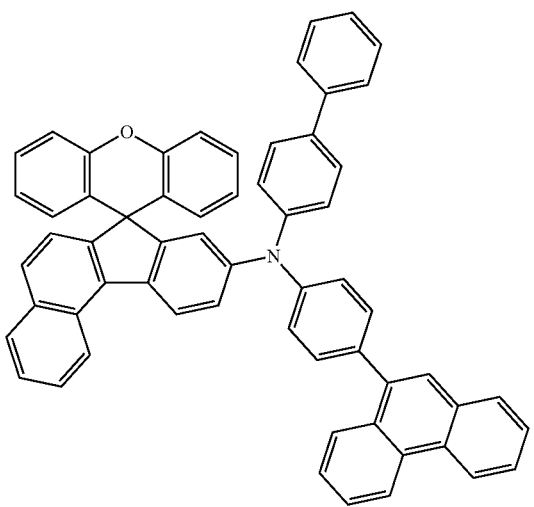
SBX18
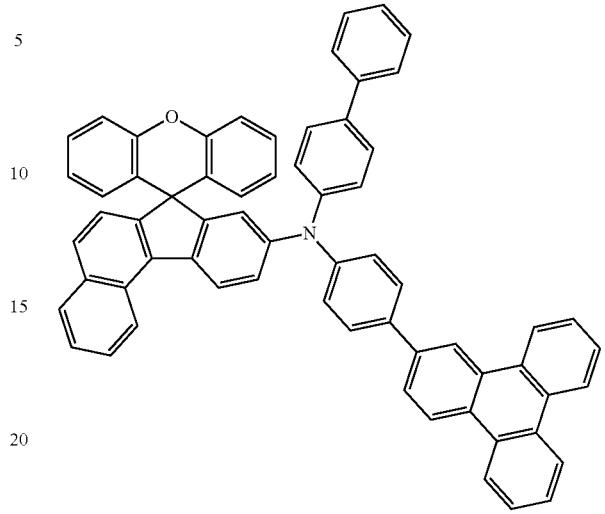
SBX19
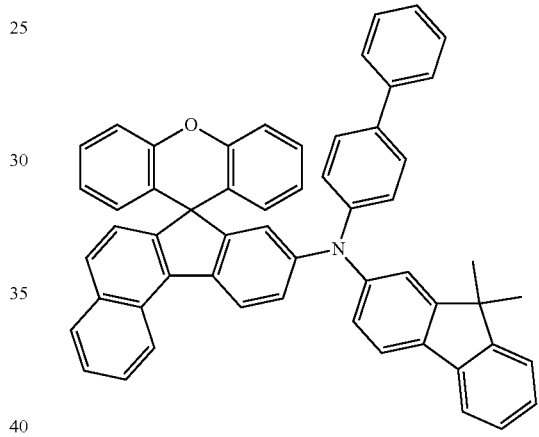
SBX20
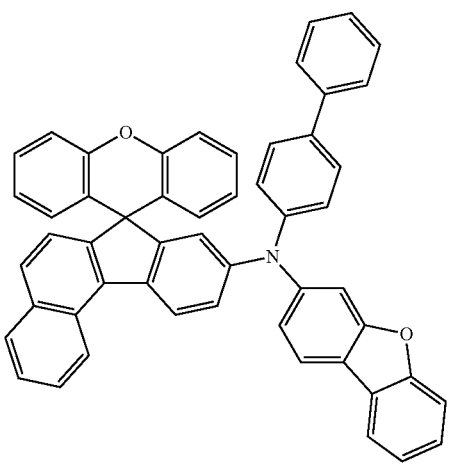

SBX21
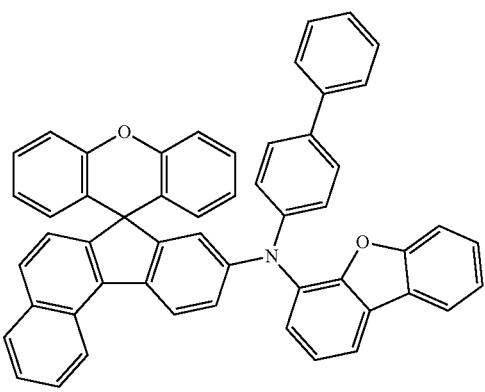
SBX22
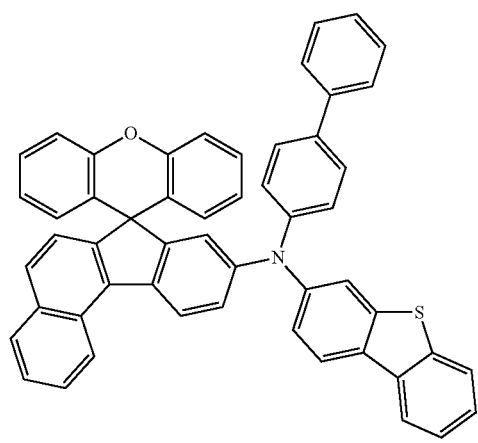
SBX23
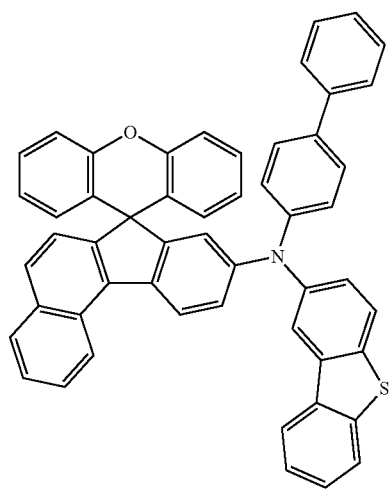
SBX24
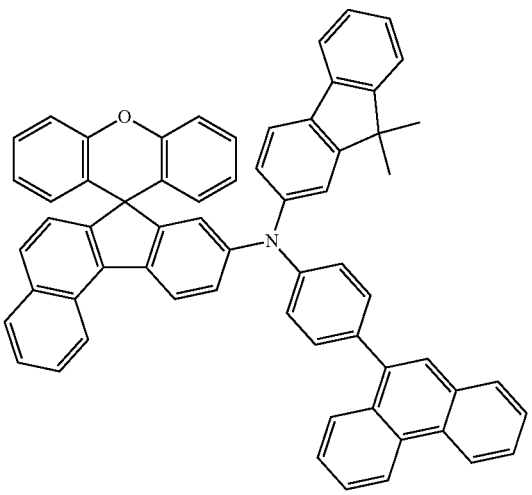
SBX25
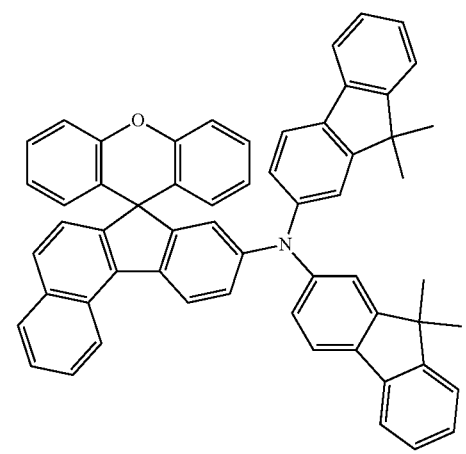
SBX26
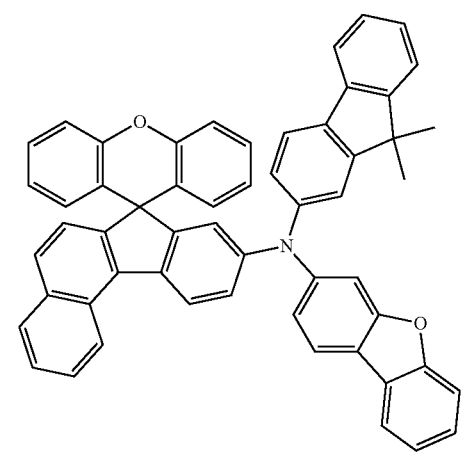

SBX27
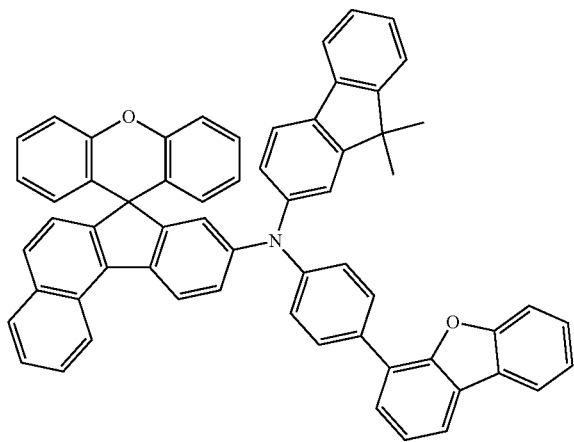
SBX28
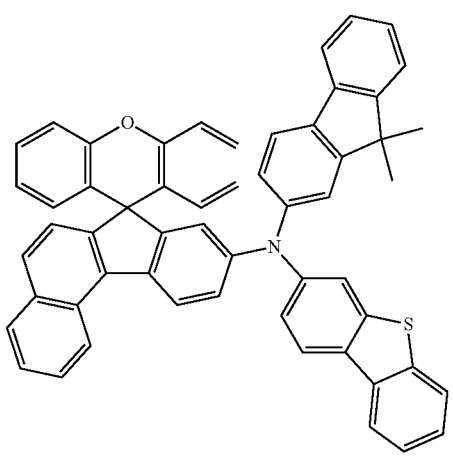
SBX29
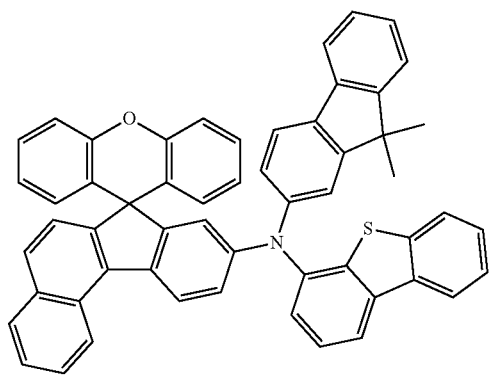
SBX30
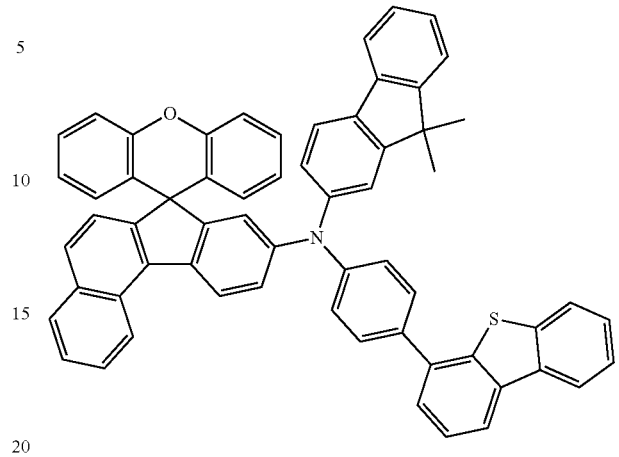
SBX31
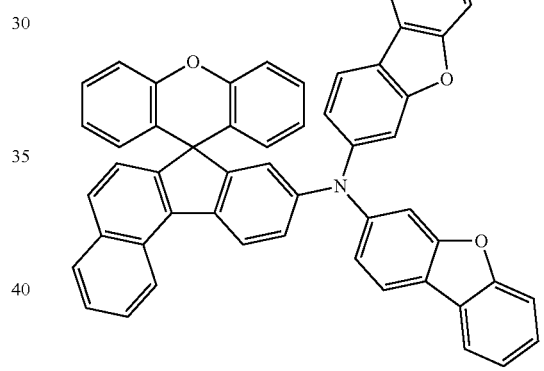
SBX32
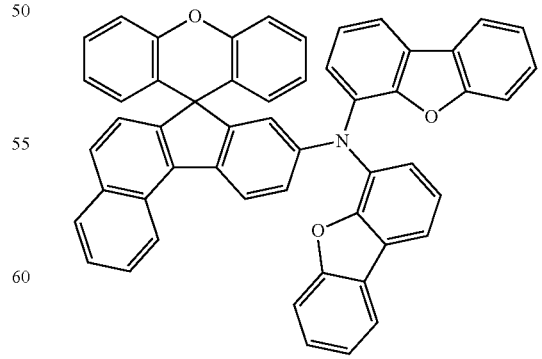

SBX33
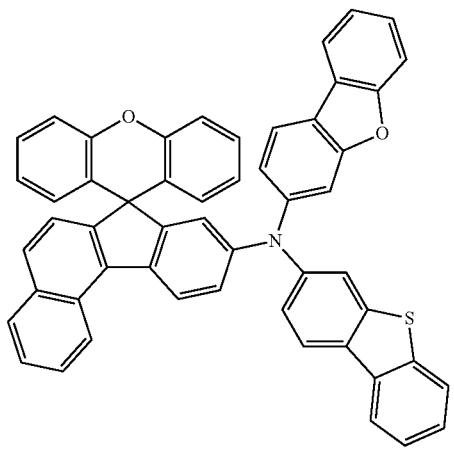
SBX36
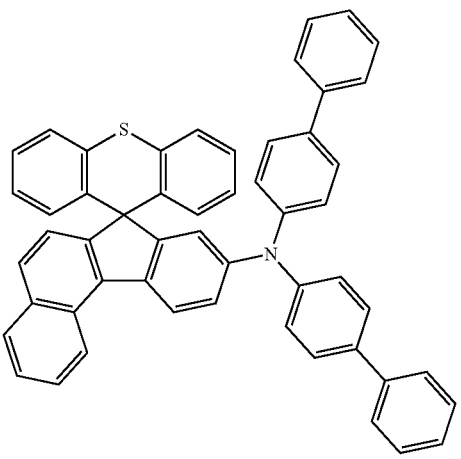
SBX34
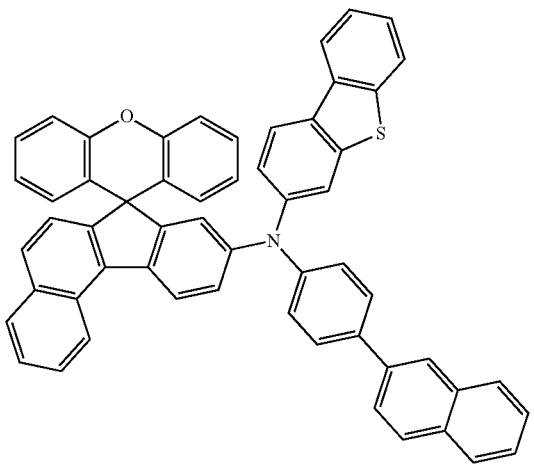
SBX37
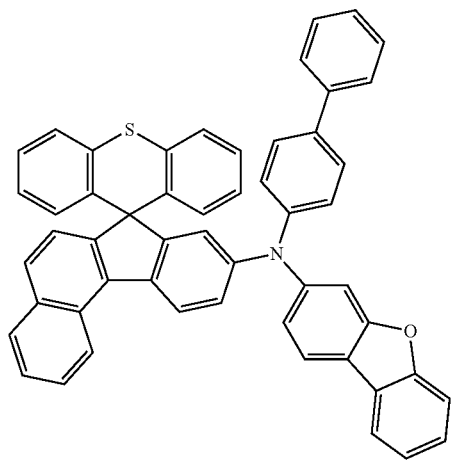
SBX35
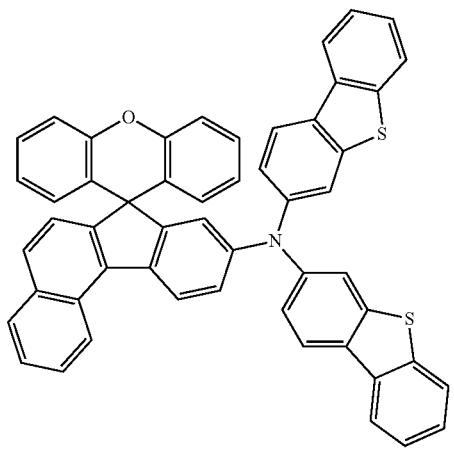
SBX38
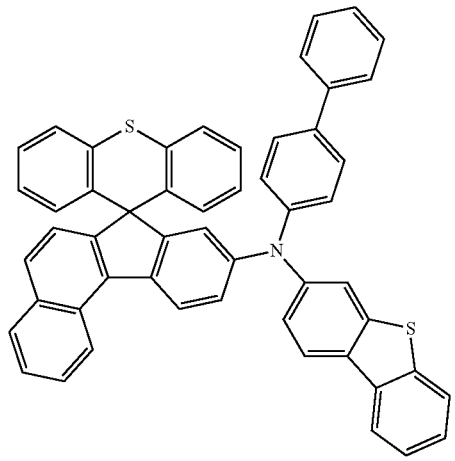

SBX39
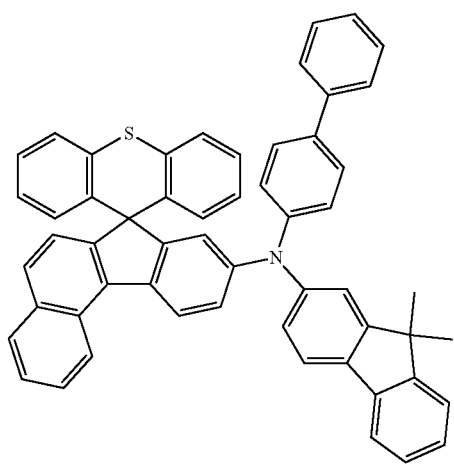
SBX40
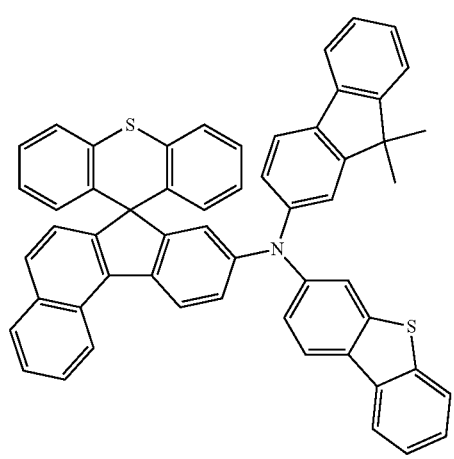
SBX41
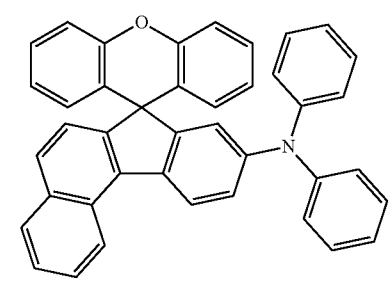
SBX42
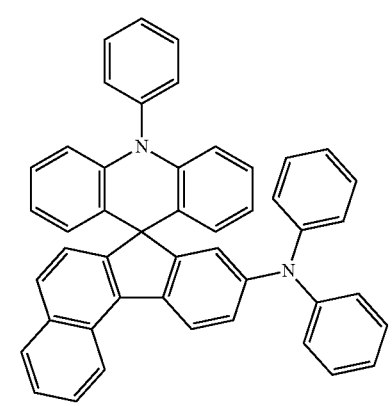
SBX43
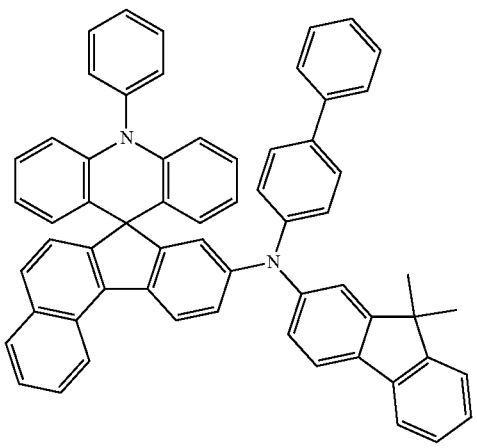
SBX44
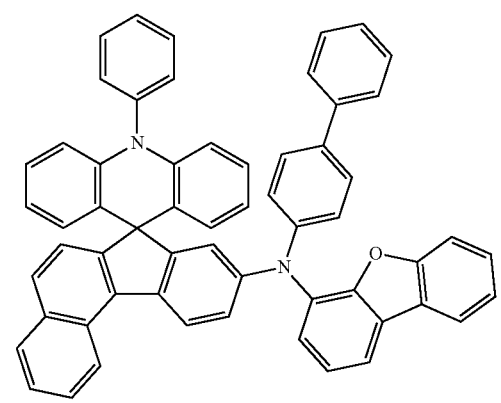
4. The organic electric element according to claim 1, wherein the compound represented by the chemical formula 2 is one or more of the following compounds:
T1
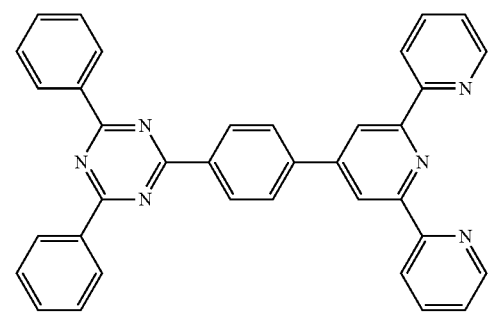

T2
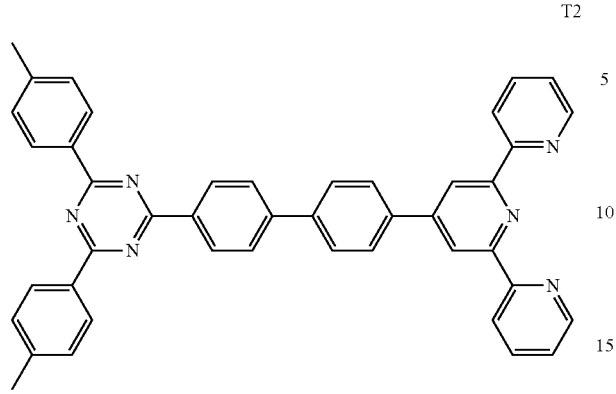
T6
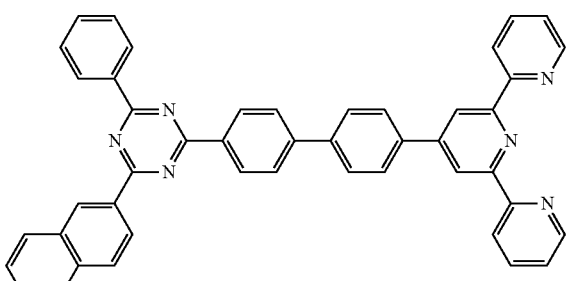
T3
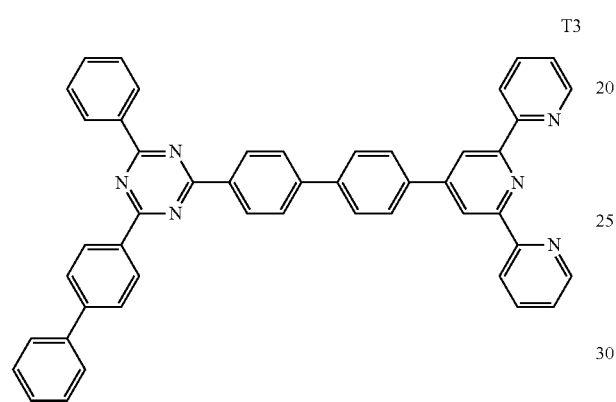
T7
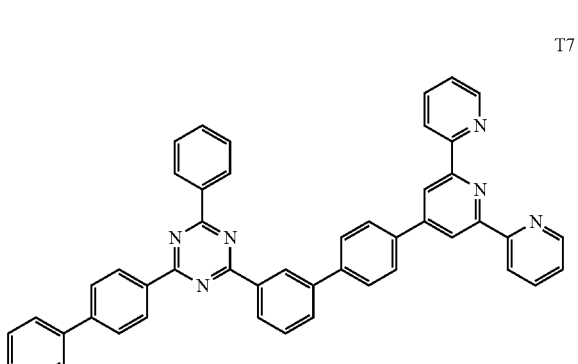
T4
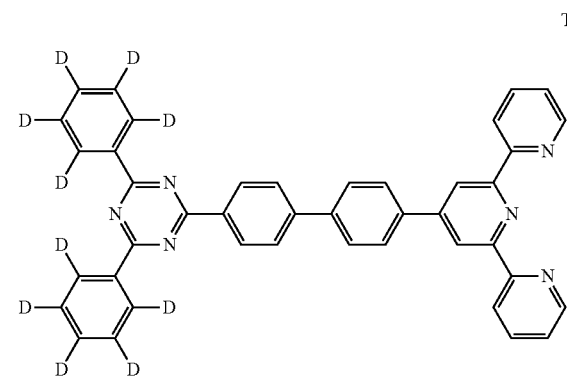
T8
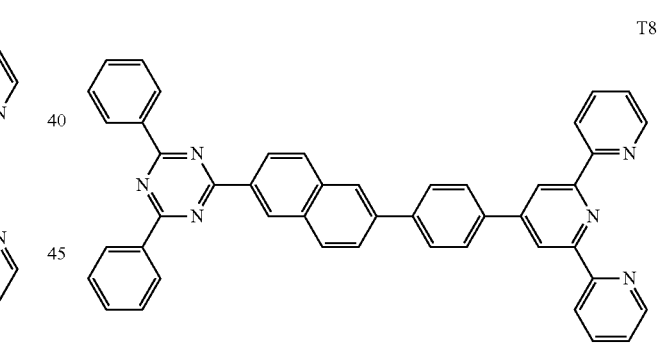
T5
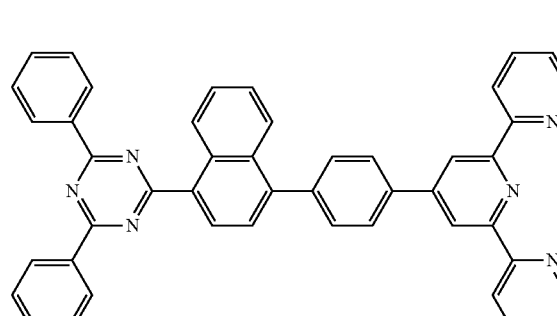
T9
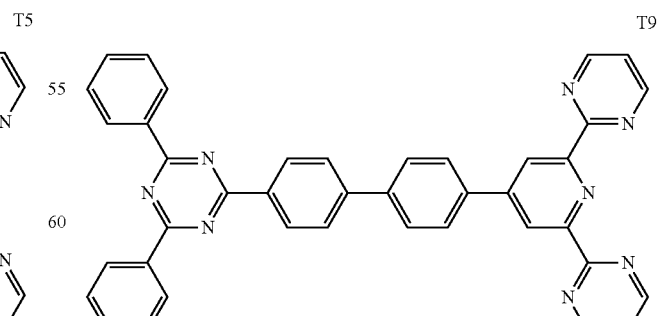

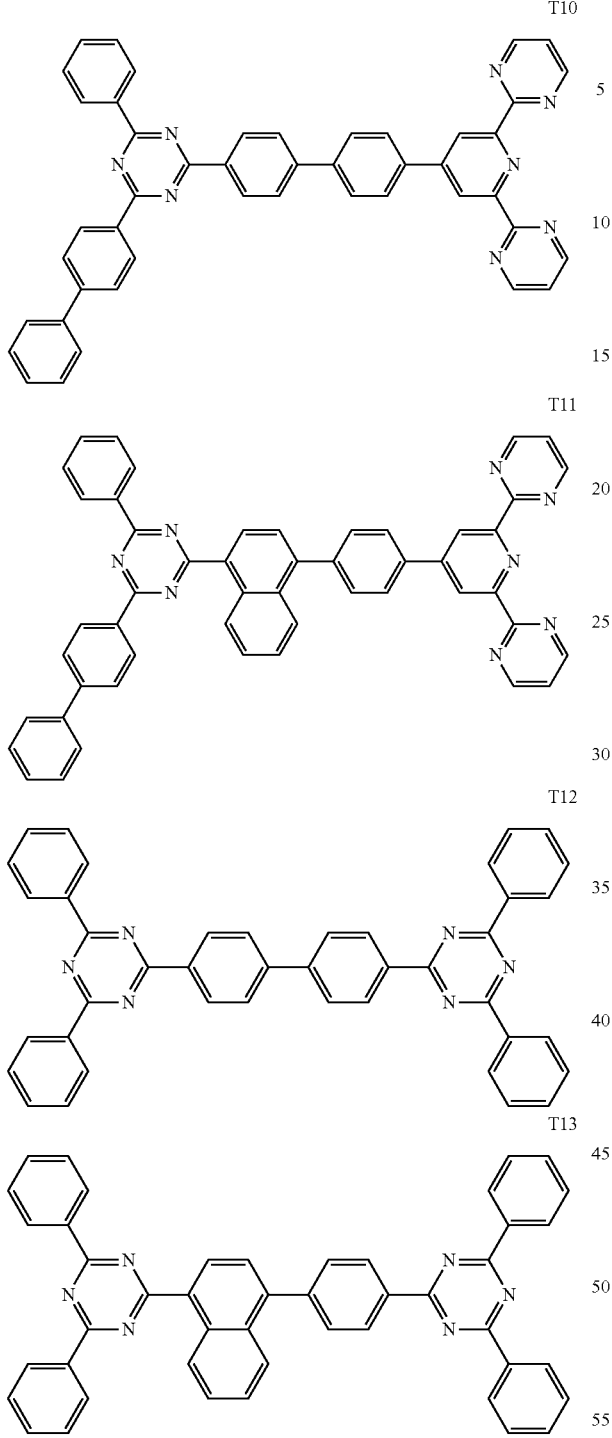

5. The organic electric element according to claim 1, wherein the first layer is positioned between the light emitting layer and the first electrode, and the second layer is positioned between the light emitting layer and the second electrode.

6. The organic electric element according to claim 1, wherein the first layer is a hole transport layer and the second layer is an electron transport layer.

7. The organic electric element according to claim 1, wherein the organic layer comprises two or more of the light emitting layers, and the first layer is positioned between the first electrode and the light emitting layer adjacent to the first electrode or between the plurality of light emitting layers.

8. The organic electric element according to claim 1, wherein the organic layer comprises two or more of the light emitting layers, and the second layer is positioned between the second electrode and the light emitting layer adjacent to the first electrode or between the plurality of light emitting layers.

9. A display panel comprising a plurality of subpixels, each of at least one of the plurality of subpixels comprising the organic electric element of claim 1.

10. A display device comprising;

the display panel of claim 9; and a driving circuit configured to drive the display panel.

* * * * *